(12) United States Patent
Ishihara et al.

(10) Patent No.: US 9,869,704 B2
(45) Date of Patent: Jan. 16, 2018

(54) POWER MEASUREMENT DEVICE, DETERMINATION METHOD, AND RECORDING MEDIUM FOR IDENTIFICATION OF CURRENT DETECTION ELEMENT DISPOSED IN AN INCORRECT DIRECTION

(71) Applicant: Mitsubishi Electric Corporation, Tokyo (JP)

(72) Inventors: Masahiro Ishihara, Tokyo (JP); Yoshiaki Koizumi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 100 days.

(21) Appl. No.: 14/890,655

(22) PCT Filed: Jun. 2, 2014

(86) PCT No.: PCT/JP2014/064604
§ 371 (c)(1),
(2) Date: Nov. 12, 2015

(87) PCT Pub. No.: WO2014/199854
PCT Pub. Date: Dec. 18, 2014

(65) Prior Publication Data
US 2016/0091538 A1    Mar. 31, 2016

(30) Foreign Application Priority Data

Jun. 13, 2013  (JP) .................................. 2013-124764

(51) Int. Cl.
*G01R 19/14*  (2006.01)
*G01R 21/06*  (2006.01)
(Continued)

(52) U.S. Cl.
CPC ............. *G01R 21/06* (2013.01); *G01R 19/14* (2013.01); *G01R 29/18* (2013.01); *G01R 31/041* (2013.01);
(Continued)

(58) Field of Classification Search
CPC ...... G01R 21/06; G01R 21/133; G01R 19/14; G01R 19/2513; G01R 29/18; G01R 31/041; G01R 31/04; G01R 35/04; G01R 22/10
See application file for complete search history.

(56) References Cited

U.S. PATENT DOCUMENTS 5,652,505 A * 7/1997 Brune ................... G01R 21/133
324/107
7,078,925 B2 * 7/2006 Long ..................... G01R 21/133
324/142
(Continued)

FOREIGN PATENT DOCUMENTS

JP    2000-258484 A    9/2000
JP    2000-292465 A    10/2000
(Continued)

OTHER PUBLICATIONS

International Search Report of the International Searching Authority dated Aug. 5, 2014 for the corresponding international application No. PCT/JP2014/064604 (and English translation).
(Continued)

*Primary Examiner* — Tung X Nguyen
*Assistant Examiner* — Lee Rodak
(74) *Attorney, Agent, or Firm* — Posz Law Group, PLC

(57) ABSTRACT

A power measurer measures, for each current transformer CT, electric energy supplied to equipment or electric energy supplied from the equipment based on a current measured by a current measurer and a voltage measured by a voltage
(Continued)

measurer. A sign memory stores, for each current transformer CT, information indicating whether the electric energy measured by the power measurer when the current transformer CT is disposed in a correct direction on a power line shows a positive sign or a negative sign. A determiner determines that, when the sign stored in the sign memory differs from the sign of the electric energy measured by the power measurer, the current transformer CT is disposed in an incorrect direction on the power line.

7 Claims, 12 Drawing Sheets

(51) Int. Cl.
*G01R 35/04* (2006.01)
*G01R 31/04* (2006.01)
*G01R 29/18* (2006.01)
G01R 19/25 (2006.01)
G01R 21/133 (2006.01)
G01R 22/10 (2006.01)

(52) U.S. Cl.
CPC .......... *G01R 35/04* (2013.01); *G01R 19/2513* (2013.01); *G01R 21/133* (2013.01); *G01R 22/10* (2013.01)

(56) References Cited

U.S. PATENT DOCUMENTS

| | | | | |
|---|---|---|---|---|
| 7,660,776 | B1* | 2/2010 | Kious | G06N 5/025 706/45 |
| 2010/0096927 | A1 | 4/2010 | Miyauchi et al. | |
| 2011/0313590 | A1* | 12/2011 | Kake | H02J 3/38 700/297 |
| 2012/0278016 | A1* | 11/2012 | Huff | G01D 4/004 702/62 |
| 2012/0286759 | A1* | 11/2012 | Ootani | G01R 21/133 323/304 |
| 2014/0197966 | A1* | 7/2014 | Kim | G01R 22/06 340/870.25 |
| 2015/0042311 | A1* | 2/2015 | Gao | G01R 35/005 324/107 |

FOREIGN PATENT DOCUMENTS

| | | |
|---|---|---|
| JP | 2006-042514 A | 2/2006 |
| JP | 2009-118673 A | 5/2009 |
| JP | 2013-140110 A | 7/2013 |
| WO | 20081102542 A1 | 8/2008 |

OTHER PUBLICATIONS

Office Action dated Jul. 29, 2014 issued in corresponding JP patent application No. 2013-124764 (and partial English translation).
Office Action dated Mar. 24, 2017 issued in corresponding CN patent application No. 201480030943.7 (and partial English translation).
Office action dated Sep. 25, 2017 in corresponding CN patent application No. 201480030943.7 (and partial English translation attached).

* cited by examiner

FIG. 8

| DISPOSITION LOCATION | L1, L2 CONNECTED WITH MASTER BREAKER | L1b, L2b CONNECTED WITH SOLAR POWER GENERATION SYSTEM | L1c, L2c CONNECTED WITH ELECTRICITY STORAGE SYSTEM | L1d CONNECTED WITH HOME EQUIPMENT |
|---|---|---|---|---|
| SIGN OF ELECTRIC ENERGY | POSITIVE, NEGATIVE | NEGATIVE | POSITIVE, NEGATIVE | POSITIVE |

FIG. 9

| NAME OF CURRENT TRANSFORMER | CT1 | CT2 | CT3 | CT4 | CT5 | CT6 | CT7 |
|---|---|---|---|---|---|---|---|
| DISPOSITION LOCATION | L1 CONNECTED WITH MASTER BREAKER | L2 CONNECTED WITH MASTER BREAKER | L1b CONNECTED WITH SOLAR POWER GENERATION SYSTEM | L2b CONNECTED WITH SOLAR POWER GENERATION SYSTEM | L1c CONNECTED WITH ELECTRICITY STORAGE SYSTEM | L2c CONNECTED WITH ELECTRICITY STORAGE SYSTEM | L1d CONNECTED WITH HOME EQUIPMENT |

FIG. 10

| NAME OF ELECTRIC ENERGY (NAME OF CURRENT TRANSFORMER) | P1 (CT1) | P2 (CT2) | P3 (CT3) | P4 (CT4) | P5 (CT5) | P6 (CT6) | P7 (CT7) |
|---|---|---|---|---|---|---|---|
| SIGN OF ELECTRIC ENERGY | POSITIVE, NEGATIVE | POSITIVE, NEGATIVE | NEGATIVE | NEGATIVE | POSITIVE, NEGATIVE | POSITIVE, NEGATIVE | POSITIVE |

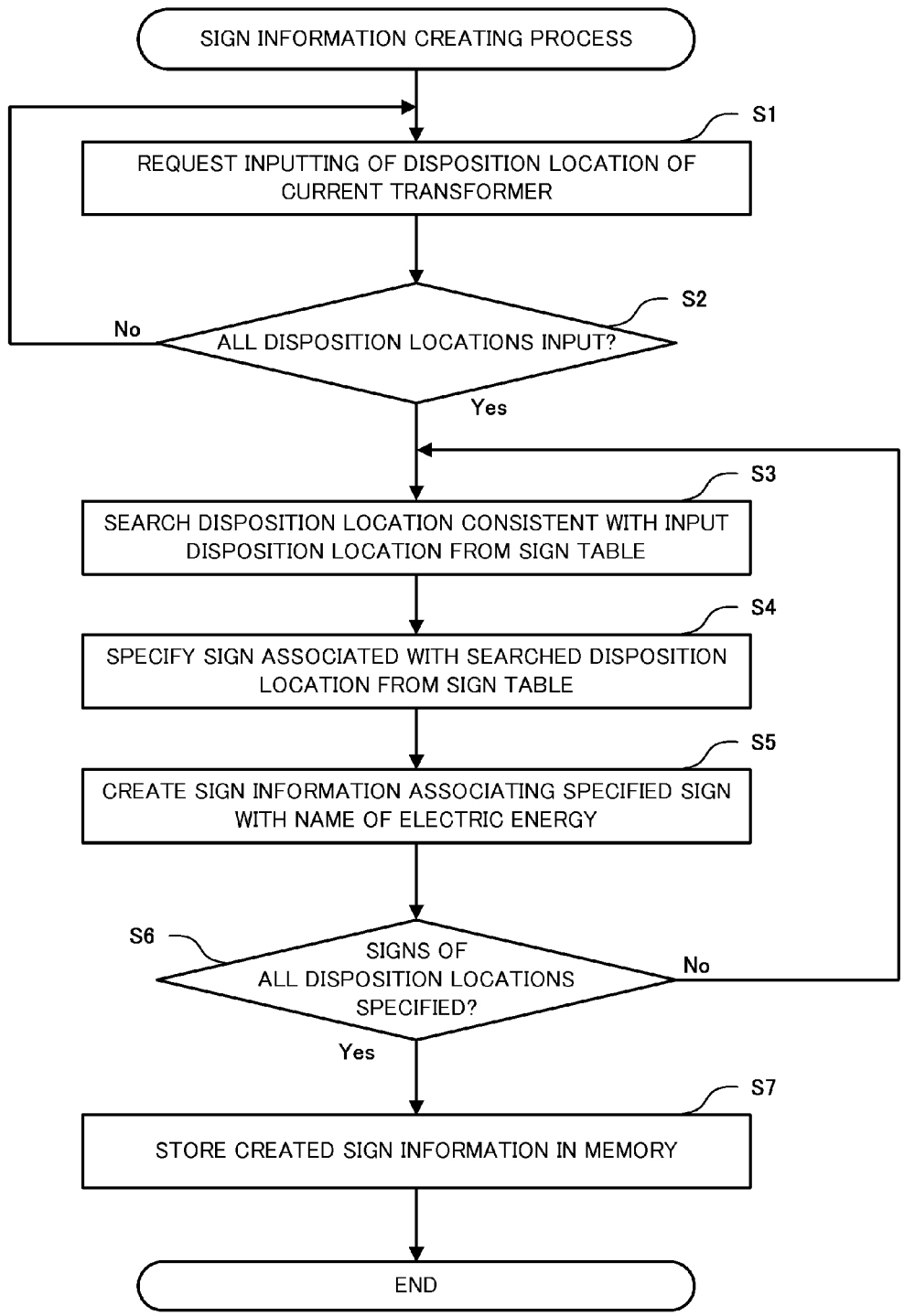

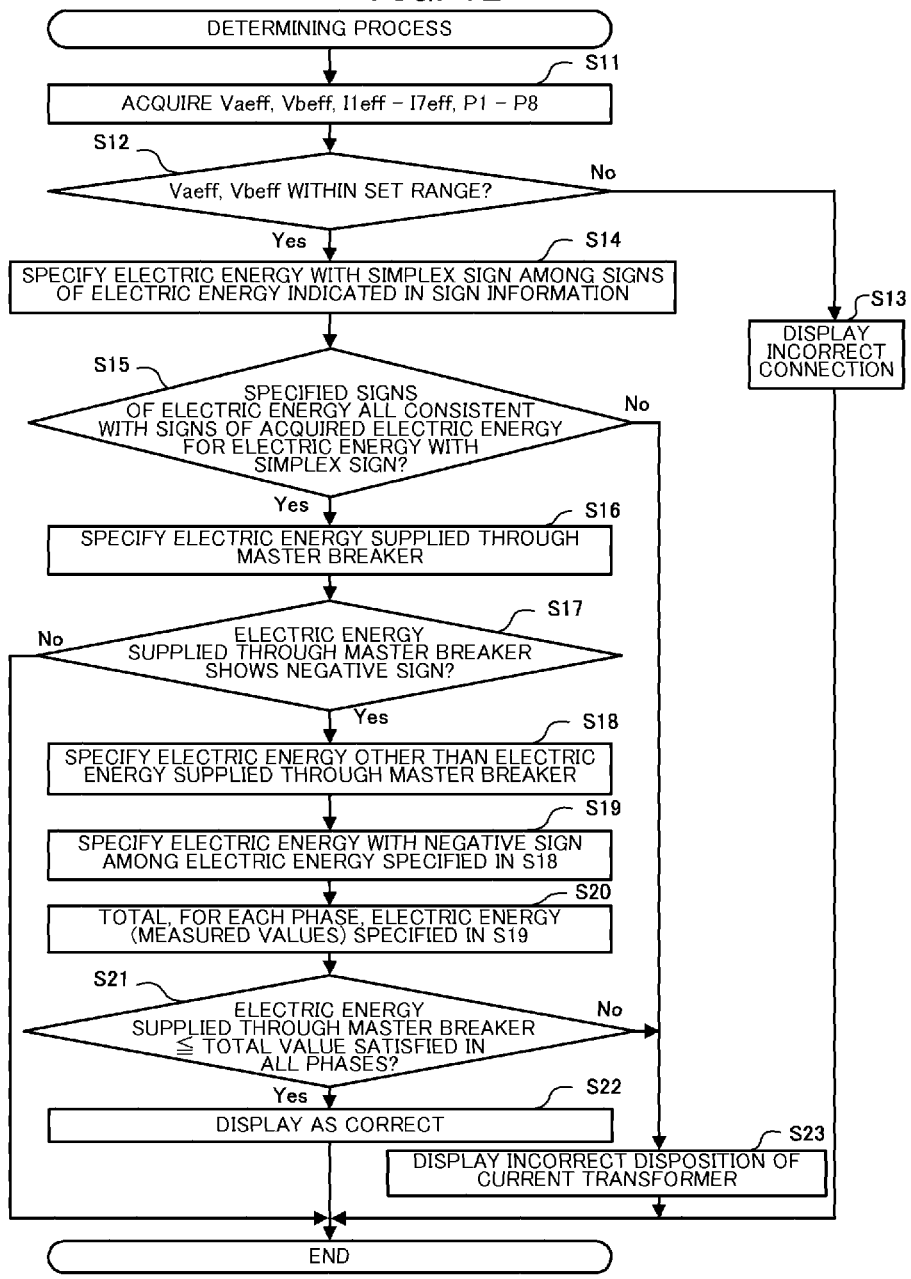

POWER MEASUREMENT DEVICE, DETERMINATION METHOD, AND RECORDING MEDIUM FOR IDENTIFICATION OF CURRENT DETECTION ELEMENT DISPOSED IN AN INCORRECT DIRECTION

CROSS REFERENCE TO RELATED APPLICATIONS

This application is a U.S. national stage of International Patent Application No. PCT/JP2014/064604 filed on Jun. 2, 2014, which claims priority to Japanese Patent Application No. 2013-124764 filed on Jun. 13, 2013, the contents of which are incorporated herein by reference.

TECHNICAL FIELD

The present disclosure relates to a power measurement device, a determination method, and a program.

BACKGROUND ART

A wire-connection condition detection device disclosed in Patent Literature 1 is known as a device that measures electric energy supplied to a load through a power line from a three-phase AC power source. This wire-connection condition detection device determines whether the connection of an alligator clip (terminal) connected with the power line to measure a phase voltage, and the disposition of a clamp sensor (current transformer) disposed on the outer circumference of the power line to measure a phase current are both correct as follow.

This wire-connection condition detection device determines, based on the phase voltage measured through the terminal, whether the effective value of the phase voltage is within a predetermined range, and whether the phase sequence is in the predetermined sequence. In addition, this wire-connection condition detection device also determines, based on the phase voltage measured through the terminal and the phase current measured through the current transformer, whether the phase difference between the phase voltage and the phase current for each phase is within a predetermined range, and whether no phase voltage or phase current is input.

Next, when the effective value of the phase voltage is out of the predetermined range, the phase sequence differs from the predetermined sequence, the phase difference between the phase voltage and the phase current for each phase is out of the predetermined range, or, no phase voltage or phase current is input, this wire-connection condition detection device determines that the terminal is incorrectly connected or the current transformer is incorrectly disposed.

CITATION LIST

Patent Literature

Patent Literature 1: Unexamined Japanese Patent Application Kokai Publication No. 2000-258484

SUMMARY OF INVENTION

Technical Problem

This wire-connection condition detection device is constructed for equipment that consumes power (in other words, equipment to which power is supplied). Hence, when, for example, a solar power generation system (in other words, equipment that supplies power) connected with the power line produces a reverse tidal current, this wire-connection condition detection device acquires electric energy as the power being consumed.

Accordingly, this wire-connection condition detection device is unable to measure the electric energy even if, for example, the solar power generation system connected with the power line produces a reverse tidal current and supplies power.

In addition, when, for example, the solar power generation system is connected with the power line, this wire-connection condition detection device is unable to determine whether or not the direction (disposition relative to the power line) of a current detection element like a current transformer that detects a current flowing through this power line is correct.

The present disclosure has been made in view of the aforementioned circumstances, and it is an objective of the present disclosure to provide a power measurement device, a determination method, and a program which can measure electric energy even if, in addition to equipment to which power is supplied, equipment that supplies power is connected with a power line, and which can also determine whether a current detection element is disposed in an incorrect direction on the power line.

Solution to Problem

In order to accomplish the above objective, a voltage measurer of a power measurement device is connected with a plurality of power lines feeding power in a plurality of phases, and is configured to measure a voltage in each phase of the plurality of phases. A current measurer is configured to measure, through a current detection element disposed on a power line of the plurality of power lines, a current input to equipment connected with the power line, or a current output by the equipment. A power measurer is configured to measure, for each current detection element, electric energy supplied to the equipment or electric energy supplied from the equipment based on the current measured by the current measurer and the voltage measured by the voltage measurer. A sign memory is configured to store, for each current detection element, information indicating whether the electric energy measured by the power measurer when the current detection element is disposed in a correct direction on the power line shows a positive sign or a negative sign. A determiner is configured to determine that, when the sign stored in the sign memory is inconsistent with the sign of the electric energy measured by the power measurer, the current detection element is disposed in an incorrect direction on the power line.

Advantageous Effects of Invention

The power measurer measures, for each current detection element, the electric energy supplied to the equipment or the electric energy supplied from the equipment based on the current measured by the current measurer and the voltage measured by the voltage measurer. Hence, according to the present disclosure, it becomes possible to measure the electric energy even if, in addition to equipment to which power is supplied, the equipment that supplies power is connected with the power line.

In addition, the determiner determines that, when the sign stored in the sign memory is inconsistent with the sign of the electric energy measured by the power measurer, the current detection element is disposed in an incorrect direction on the power line. Hence, according to the present disclosure, it becomes possible to determine that the current detection element is disposed in an incorrect direction on the power line even if, in addition to equipment to which power is supplied, the equipment that supplies power is connected with the power line.

BRIEF DESCRIPTION OF DRAWINGS

FIG. 8 is a diagram illustrating an example sign table according to the embodiment of the present disclosure;

FIG. 9 is a diagram illustrating example disposition information according to the embodiment of the present disclosure;

FIG. 10 is a diagram illustrating example sign information according to the embodiment of the present disclosure;

FIG. 11 is a flowchart illustrating a sign information creating process according to the embodiment of the present disclosure; and FIG. 12 is a flowchart illustrating a determining process according to the embodiment of the present disclosure.

DESCRIPTION OF EMBODIMENTS

Figure 1:
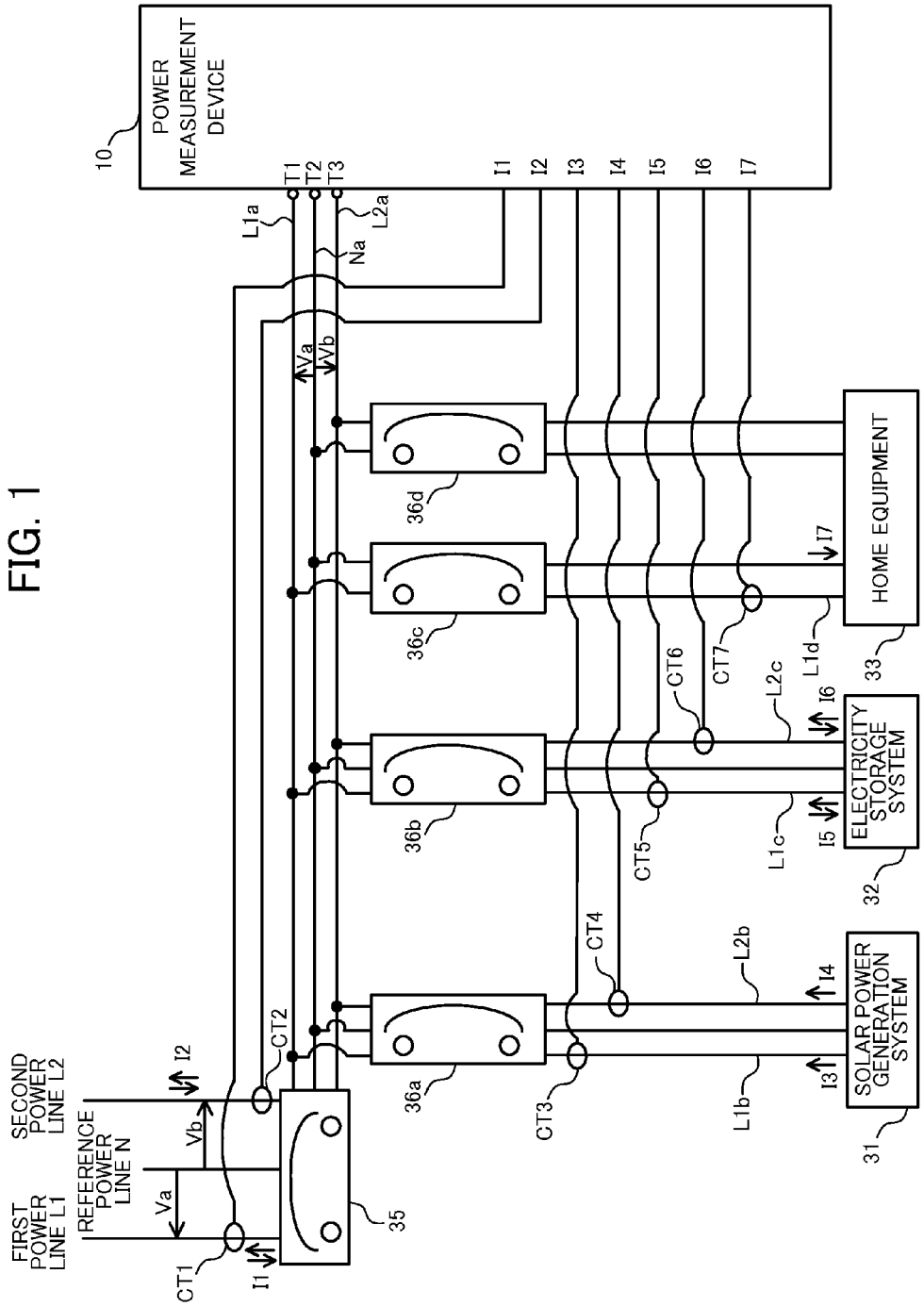
FIG. 1 is a connection diagram of a power measurement device according to an embodiment of the present disclosure.

A power measurement device 10 according to an embodiment of the present disclosure will be explained below with reference to FIG. 1 to FIG. 12. The power measurement device 10 is capable of measuring electric energy even if, in addition to equipment to which power is supplied, equipment that supplies power (equipment that may cause a reverse tidal current) is connected with a power line, and is also capable of determining that a current transformer CT that is a current detection element is disposed in an incorrect direction on the power line.

The power measurement device 10 measures electric energy supplied from a solar power generation system (equipment that supplies power) 31.

In addition, the power measurement device 10 measures, when an electricity storage system 32 including secondary batteries is in a charging condition, electric energy supplied to the electricity storage system 32 through three power lines L1, L2, and N connected with respective phases of a single-phase three-line power source. Still further, the power measurement device 10 measures, when the electricity storage system 32 is in a discharging condition, electric energy supplied from the electricity storage system 32.

Yet still further, the power measurement device 10 measures electric energy (electric energy consumed by home equipment) supplied to home equipment (equipment to which power is supplied) 33 through the power lines L1, L2, and N.

The power measurement device 10 is disposed in, for example, a power distribution board. The power lines L1, L2, and N serve as distribution lines that draw power from the single-phase three-line power source (external line) to the power distribution board. The power distribution board is provided with a master breaker (master switch) 35. The power lines L1, L2, and N are connected to one terminal of the master breaker 35. The other terminal of the master breaker 35 is connected with indoor wirings L1a, L2a, and Na. The power line L1, the reference power line N, and the power line L2 are electrically conducted with the indoor wiring L1a, the reference indoor wiring Na, and the indoor wiring L2a, respectively.

The single-phase three-line power source applies a first-phase voltage Va between the power line L1 and the reference power line N, and a second-phase voltage Vb between the power line L2 and the reference power line N, and, the second-phase voltage has a phase difference from the voltage Va which is 180 degrees. Hence, the voltage Va is applied between the indoor wiring L1a and the reference indoor wiring Na, and the voltage Vb is applied between the indoor wiring L2a and the reference indoor wiring Na.

The indoor wiring L1a, the indoor wiring L2a, and the reference indoor wiring Na are connected with a power conditioner of the solar power generation system 31 through a branching breaker 36a. Hence, when the solar power generation system 31 generates power through solar light panels, AC currents are output to the indoor wiring L1a and the indoor wiring L2a. As explained above, the solar power generation system 31 is equipment that supplies power (equipment that may produce reverse tidal current).

The indoor wiring L1a, the indoor wiring L2a, and the reference indoor wiring Na are connected with a power conditioner of the electricity storage system 32 through a branching breaker 36b. Hence, an AC voltage that is voltage Va+voltage Vb is applied to the power conditioner of the electricity storage system 32 when the electricity storage system 32 is in a charging condition. In addition, the power conditioner of the electricity storage system 32 outputs AC currents to the indoor wiring L1a and the indoor wiring L2a when the electricity storage system 32 is in a discharging condition. As explained above, the electricity storage system 32 is equipment to which power is supplied, and which is also equipment that supplies power (equipment that may produce reverse tidal current).

In addition, the indoor wiring L1a and the reference indoor wiring Na are connected with home equipment 33 through a branching breaker 36c. Still further, the reference indoor wiring Na and the indoor wiring L2a are connected with the home equipment 33 through the branching breaker 36d. Hence, the voltage Va and the voltage Vb are applied to the home equipment 33. The home equipment 33 is equipment to which power is supplied.

The power measurement device 10 includes terminals T1 to T3 to measure a voltage, and current transformers (Current Transformer: current transformer for gauge) CT1 to CT7 to measure a current.

More specifically, the terminal T1 is to connect the indoor wiring L1a with the power measurement device 10. The terminal T2 is to connect the reference indoor wiring Na with the power measurement device 10. The terminal T3 is to connect the indoor wiring L2a with the power measurement device 10.

The current transformer CT1 is to measure a current flowing through the power line L1. The current transformer CT2 is to measure a current flowing through the power line L2.

In addition, the current transformer CT3 is to measure a current supplied from the solar power generation system 31 to the indoor wiring L1a. The current transformer CT4 is to measure a current supplied from the solar power generation system 31 to the indoor wiring L2a.

Still further, the current transformer CT5 is to measure a current supplied from the indoor wiring L1a to the electricity storage system 32, and a current supplied from the electricity storage system 32 to the indoor wiring L1a. The current transformer CT6 is to measure a current supplied from the indoor wiring L2a to the electricity storage system 32, and a current supplied from the electricity storage system 32 to the indoor wiring L2a.

Yet still further, the current transformer CT7 is to measure a current supplied from the indoor wiring L1a to the home equipment 33.

The current transformers CT1 to CT7 have respective polarities. Hence, when the current transformers CT1 to CT7 are not disposed in a predetermined direction (correct direction), the electric energy acquired by the power measurement device 10 has an opposite polarity.

Hence, according to this embodiment, the current transformer CT1 is disposed in a direction in which the sign of the electric energy acquired by the power measurement device 10 becomes positive when the current flows from the power line L1 to the indoor wiring L1a. In addition, the current transformer CT2 is disposed in a direction in which the sign of the electric energy acquired by the power measurement device 10 becomes positive when the current flows from the power line L2 to the indoor wiring L2a.

Still further, according to this embodiment, the current transformer CT3 is disposed in a direction in which the sign of the electric energy acquired by the power measurement device 10 becomes negative when the current flows from the power conditioner of the solar power generation system 31 to the indoor wiring L1a. Yet still further, the current transformer CT4 is disposed in a direction in which the sign of the electric energy acquired by the power measurement device 10 becomes negative when the current flows from the power conditioner of the solar power generation system 31 to the indoor wiring L2a.

In addition, according to this embodiment, the current transformer CT5 is disposed in a direction in which the sign of the electric energy acquired by the power measurement device 10 becomes negative when the current flows from the power conditioner of the electricity storage system 32 to the indoor wiring L1a. Still further, the current transformer CT6 is disposed in a direction in which the sign of the electric energy acquired by the power measurement device 10 becomes negative when the current flows from the power conditioner of the electricity storage system 32 to the indoor wiring L2a.

Yet still further, according to this embodiment, the current transformer CT7 is disposed in a direction in which the sign of the electric energy acquired by the power measurement device 10 becomes positive when the current flows from the indoor wiring L1a to the home equipment 33.

Figure 2:
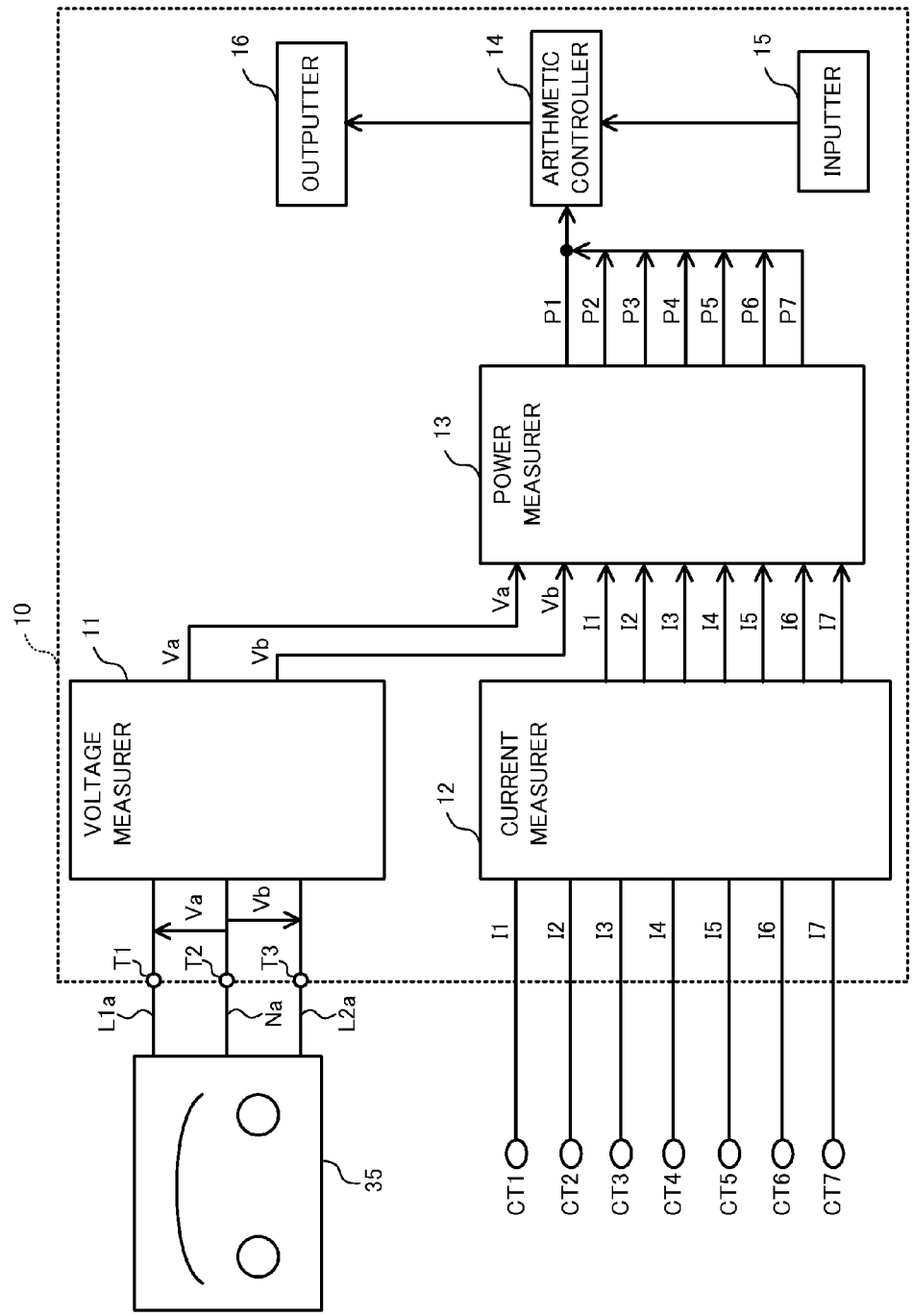
FIG. 2 is a block diagram of the power measurement device according to the embodiment of the present disclosure.

As illustrated in FIG. 2, the power measurement device 10 includes a voltage measurer 11 that measures a voltage, a current measurer 12 that measures a current, and a power measurer 13 that acquires electric energy based on the voltage measured by the voltage measurer 11 and the current measured by the current measurer 12.

In addition, the power measurement device 10 includes an arithmetic controller 14 that controls the whole power measurement device 10, an inputter 15 that allows a system constructor (user) to input information, and an outputter 16 that outputs information indicating that, for example, the direction of the current transformer CT is incorrect.

Figure 3:
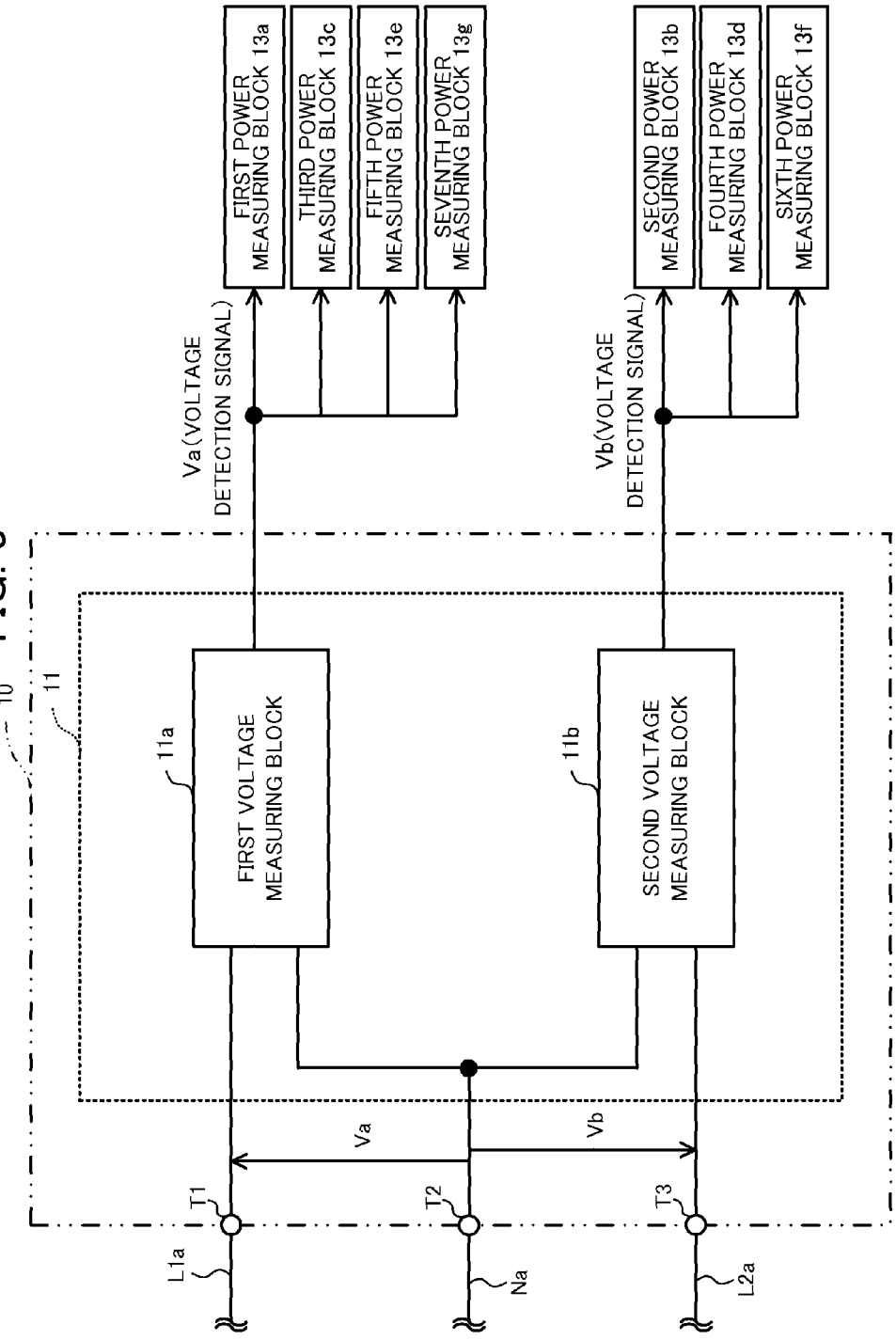
FIG. 3 is a block diagram of a voltage measurer according to the embodiment of the present disclosure.
Figure 4:
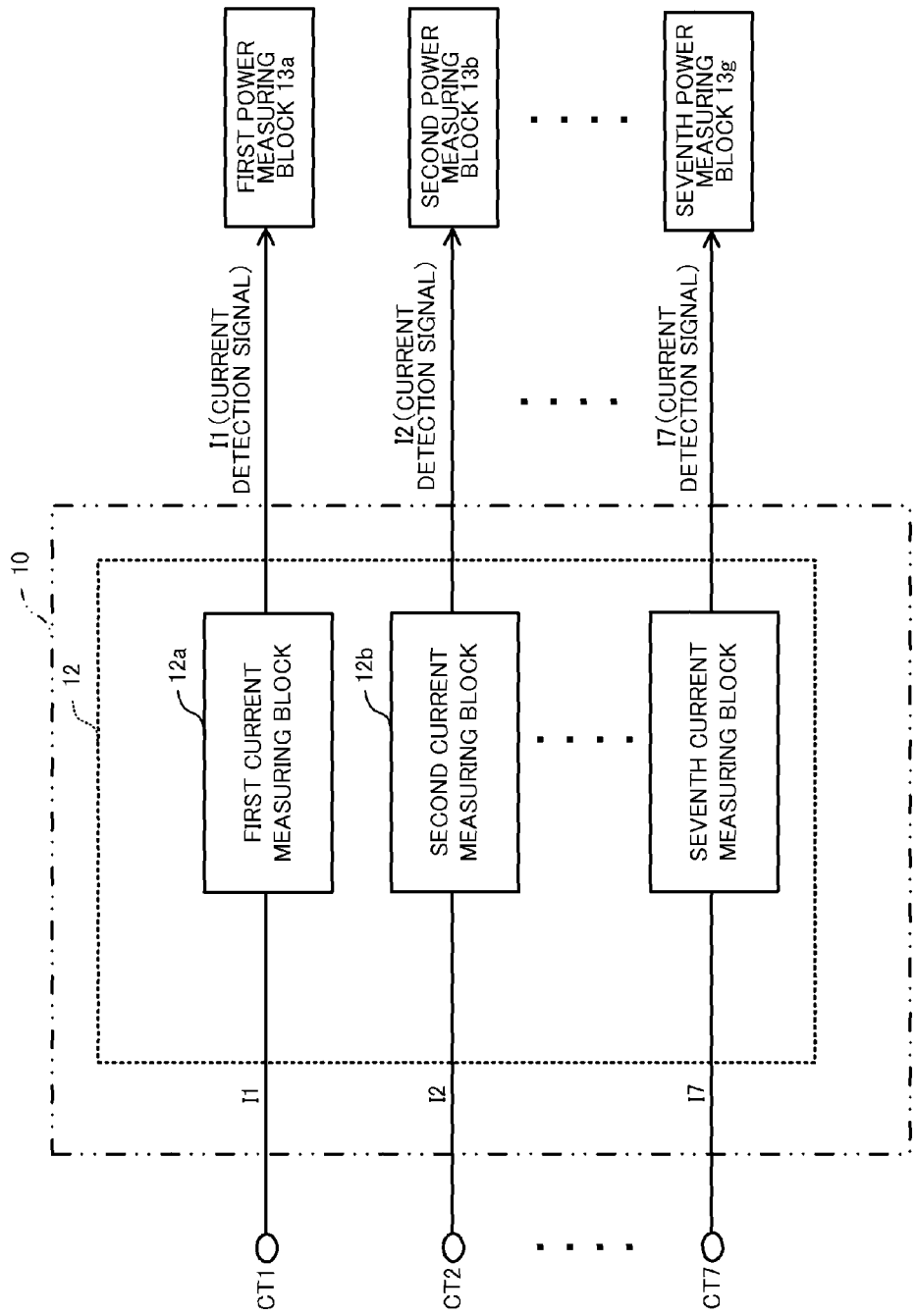
FIG. 4 is a block diagram of a current measurer according to the embodiment of the present disclosure.

More specifically, the voltage measurer 11 is connected with the terminals T1 to T3. The voltage measurer 11 includes, for example, a PT (Potential Transformer: transformer for gauge) or a resistor voltage dividing circuit. The voltage measurer 11 converts the voltage (voltage Va and voltage Vb) applied to the terminals T1 to T3 into voltages correct for inputting to the power measurer 13, and outputs the converted voltages to the power measurer 13. As illustrated in FIG. 3, the voltage measurer 11 includes a first voltage measuring block 11a that measures the voltage Va, and a second voltage measuring block 11b that measures the voltage Vb.

The first voltage measuring block 11a is connected with the indoor wiring L1a and the reference indoor wiring Na, and steps down the first-phase voltage Va between the indoor wiring L1a and the reference indoor wiring Na. Next, the first voltage measuring block 11a creates a voltage signal (hereinafter, for clarification, referred to as a voltage detection signal) that indicates an instantaneous value of the first-phase voltage Va, and outputs this voltage signal to a first power measuring block 13a.

The second voltage measuring block 11b is connected with the reference indoor wiring Na and the indoor wiring L2a, and steps down the second-phase voltage Vb between the reference indoor wiring Na and the indoor wiring L2a. Next, the second voltage measuring block 11b creates a voltage detection signal that indicates the second-phase voltage Vb, and outputs this voltage signal to a second power measuring block 13b.

As illustrated in FIG. 2, the current measurer 12 is connected with the current transformers CT1 to CT7. The current measurer 12 is, for example, load resistors. The current measurer 12 measures respective currents I1 to I7 through the current transformers CT1 to CT7, creates a voltage signal (hereinafter, for clarification, referred to as a current detection signal) that indicates a measured current value (instantaneous value), and outputs this signal to the power measurer 13.

The current measurer 12 includes a first current measuring block 12a that measures the current I1, a second current measuring block 12b that measures the current I2, a third current measuring block 12c that measures the current I3, a fourth current measuring block 12d that measures the current I4, a fifth current measuring block 12e that measures the current I5, a sixth current measuring block 12f that measures the current I6, and a seventh current measuring block 12g that measures the current I7.

More specifically, the first current measuring block 12a transforms, through the current transformer CT1, the current I1 that flows from the power line L1 to the indoor wiring L1a, or the current I1 that flows from the indoor wiring L1a to the power line L1 at a constant current transformation ratio. Next, the first current measuring block 12a causes the transformed current I1 to flow through load resistors, thereby creating a voltage signal (current detection signal) that indicates the value of the current I1. The first current measuring block 12a outputs the created voltage signal to the power measurer 13 (first power measuring block 13a).

The second current measuring block 12b transforms, through the current transformer CT2, the current I2 that flows from the power line L2 to the indoor wiring L2a, or the current I2 that flows from the indoor wiring L2a to the power line L2 at a constant current transformation ratio. Next, the second current measuring block 12b causes the transformed current I2 to flow through load resistors, thereby creating a voltage signal (current detection signal) that indicates the value of the current I2. The second current measuring block 12b outputs the created voltage signal to the power measurer 13 (second power measuring block 13b).

The third current measuring block 12c transforms, through the current transformer CT3, the current I3 that flows from the power conditioner of the solar power generation system 31 to the indoor wiring L1a at a constant current transformation ratio. Next, the third current measuring block 12c causes the transformed current I3 to flow through load resistors, thereby creating a voltage signal (current detection signal) that indicates the value of the current I3. The third current measuring block 12c outputs the created voltage signal to the power measurer 13 (third power measuring block 13c).

The fourth current measuring block 12d transforms, through the current transformer CT4, the current I4 that flows from the power conditioner of the solar power generation system 31 to the indoor wiring L2a at a constant current transformation ratio. Next, the fourth current measuring block 12d causes the transformed current I4 to flow through load resistors, thereby creating a voltage signal (current detection signal) that indicates the value of the current I4. The fourth current measuring block 12d outputs the created voltage signal to the power measurer 13 (fourth power measuring block 13d).

The fifth current measuring block 12e transforms, through the current transformer CT5, the current I5 that flows from the power conditioner of the electricity storage system 32 to the indoor wiring L1a, or the current I5 that flows from the indoor wiring L1a to the power conditioner of the electricity storage system 32 at a constant current transformation ratio. Next, the fifth current measuring block 12e causes the transformed current I5 to flow through load resistors, thereby creating a voltage signal (current detection signal) that indicates the value of the current I5. The fifth current measuring block 12e outputs the created voltage signal to the power measurer 13 (fifth power measuring block 13e).

The sixth current measuring block 12f transforms, through the current transformer CT6, the current I6 that flows from the power conditioner of the electricity storage system 32 to the indoor wiring L2a, or the current I6 that flows from the indoor wiring L2a to the power conditioner of the electricity storage system 32 at a constant current transformation ratio. Next, the sixth current measuring block 12f causes the transformed current I6 to flow through load resistors, thereby creating a voltage signal (current detection signal) that indicates the value of the current I6. The sixth current measuring block 12f outputs the created voltage signal to the power measurer 13 (sixth power measuring block 13f).

The seventh current measuring block 12g transforms, through the current transformer CT7, the current I7 that flows from the indoor wiring L1a to the home equipment 33 at a constant current transformation ratio. Next, the seventh current measuring block 12g causes the transformed current I7 to flow through load resistors, thereby creating a voltage signal (current detection signal) that indicates the value of the current I7. The seventh current measuring block 12g outputs the created voltage signal to the power measurer 13 (seventh power measuring block 13g).

The power measurer 13 measures electric energy based on the value of the voltage Va, Vb in each phase measured by the voltage measurer 11, and the value of each current I1 to I7 measured by the current measurer 12, and outputs the measured electric energy to the arithmetic controller 14.

Figure 5:
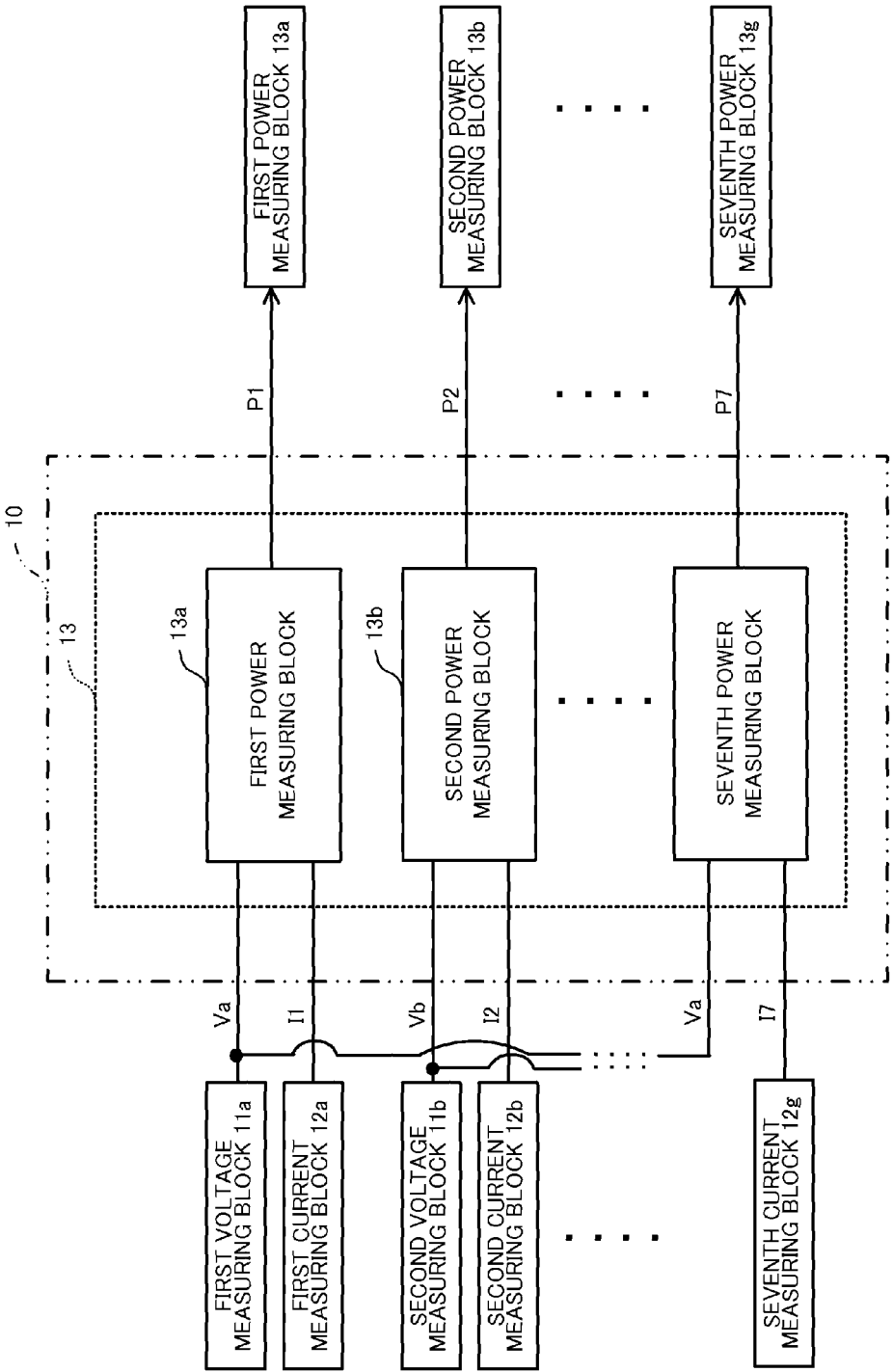
FIG. 5 is a block diagram of a power measurer according to the embodiment of the present disclosure.

As illustrated in FIG. 5, the power measurer 13 includes a first power measuring block 13a that measures electric energy P1, a second power measuring block 13b that measures electric energy P2, a third power measuring block 13c that measures electric energy P3, a fourth power measuring block 13d that measures electric energy P4, a fifth power measuring block 13e that measures electric energy P5, a sixth power measuring block 13f that measures electric energy P6, and a seventh power measuring block 13g that measures electric energy P7.

More specifically, the first power measuring block 13a measures the electric energy P1 supplied to the equipment connected with the indoor wiring L1a through the power line L1 and the reference power line N or the electric energy P1 supplied to an external load connected with an external line through the power line L1 and the reference power line N based on the value of the voltage Va measured by the first voltage measuring block 11a, and the value of the current I1 measured by the first current measuring block 12a.

When the sign of the electric energy P1 acquired by the first power measuring block 13a is positive, this indicates that the current is flowing from the power line L1 to the indoor wiring L1a. When the sign of the electric energy P1 acquired by the first power measuring block 13a is negative, this indicates that the current is flowing from the indoor wiring L1a to the power line L1.

The second power measuring block 13b measures the electric energy P2 supplied to the equipment connected with the indoor wiring L2a through the power line L2 and the reference power line N or the electric energy P2 supplied to an external load connected with an external line through the power line L2 and the reference power line N based on the value of the voltage Vb measured by the second voltage measuring block 11b, and the value of the current I2 measured by the second current measuring block 12b.

When the sign of the electric energy P2 acquired by the second power measuring block 13b is positive, this indicates that the current is flowing from the power line L2 to the indoor wiring L2a. When the sign of the electric energy P2 acquired by the second power measuring block 13b is negative, this indicates that the current is flowing from the indoor wiring L2a to the power line L2.

The third power measuring block 13c measures the electric energy P3 supplied from the solar power generation system 31 through the indoor wiring L1a and the reference indoor wiring Na based on the value of the voltage Va measured by the first voltage measuring block 11a, and the value of the current I3 measured by the third current measuring block 12c.

The solar power generation system 31 consumes no power. Hence, when the sign of the electric energy P3 acquired by the third power measuring block 13c is positive (when electric energy indicating that power is supplied to the solar power generation system 31 is acquired), the power measurement device 10 outputs information indicating that the direction of the current transformer CT is incorrect to, for example, a display (outputter 16).

The fourth power measuring block 13d measures the electric energy P4 supplied from the solar power generation system 31 through the indoor wiring L2a and the reference indoor wiring Na based on the value of the voltage Vb measured by the second voltage measuring block 11b, and the value of the current I4 measured by the fourth current measuring block 12d.

When the sign of the electric energy P4 acquired by the fourth power measuring block 13d is positive (when electric energy indicating that power is supplied to the solar power generation system 31 is acquired), the power measurement device 10 outputs information indicating that the direction of the current transformer CT is incorrect to, for example, the display (outputter 16).

The fifth power measuring block 13e measures the electric energy P5 supplied to the electricity storage system 32 through the indoor wiring L1a and the reference indoor wiring Na, or the electric energy P5 supplied from the electricity storage system 32 through the indoor wiring L1a and the reference indoor wiring Na based on the value of the voltage Va measured by the first voltage measuring block 11a, and the value of the current I5 measured by the fifth current measuring block 12e.

When the sign of the electric energy P5 acquired by the fifth power measuring block 13e is negative, this indicates that power is supplied from the electricity storage system 32. When the sign of the electric energy P5 acquired by the fifth power measuring block 13e is positive, this indicates that power is supplied to the electricity storage system 32.

The sixth power measuring block 13f measures the electric energy P6 supplied to the electricity storage system 32 through the indoor wiring L2a and the reference indoor wiring Na, or the electric energy P6 supplied from the electricity storage system 32 through the indoor wiring L2a and the reference indoor wiring Na based on the value of the voltage Vb measured by the second voltage measuring block 11b, and the value of the current I6 measured by the sixth current measuring block 12f.

When the sign of the electric energy P6 acquired by the sixth power measuring block 13f is negative, this indicates that power is supplied from the electricity storage system 32. When the sign of the electric energy P6 acquired by the sixth power measuring block 13f is positive, this indicates that power is supplied to the electricity storage system 32.

The seventh power measuring block 13g measures the electric energy P7 supplied to the home equipment 33 through the indoor wiring L1a and the reference indoor wiring Na based on the value of the voltage Va measured by the first voltage measuring block 11a, and the value of the current I7 measured by the seventh current measuring block 12g.

The home equipment 33 supplies no power. Hence, when the electric energy P7 acquired by the seventh power measuring block 13g shows a negative sign (when electric energy indicating that power is supplied from home equipment 33 is acquired), the power measurement device 10 outputs information indicating that the direction of the current transformer CT is incorrect to, for example, a display (outputter 16).

Figure 6:
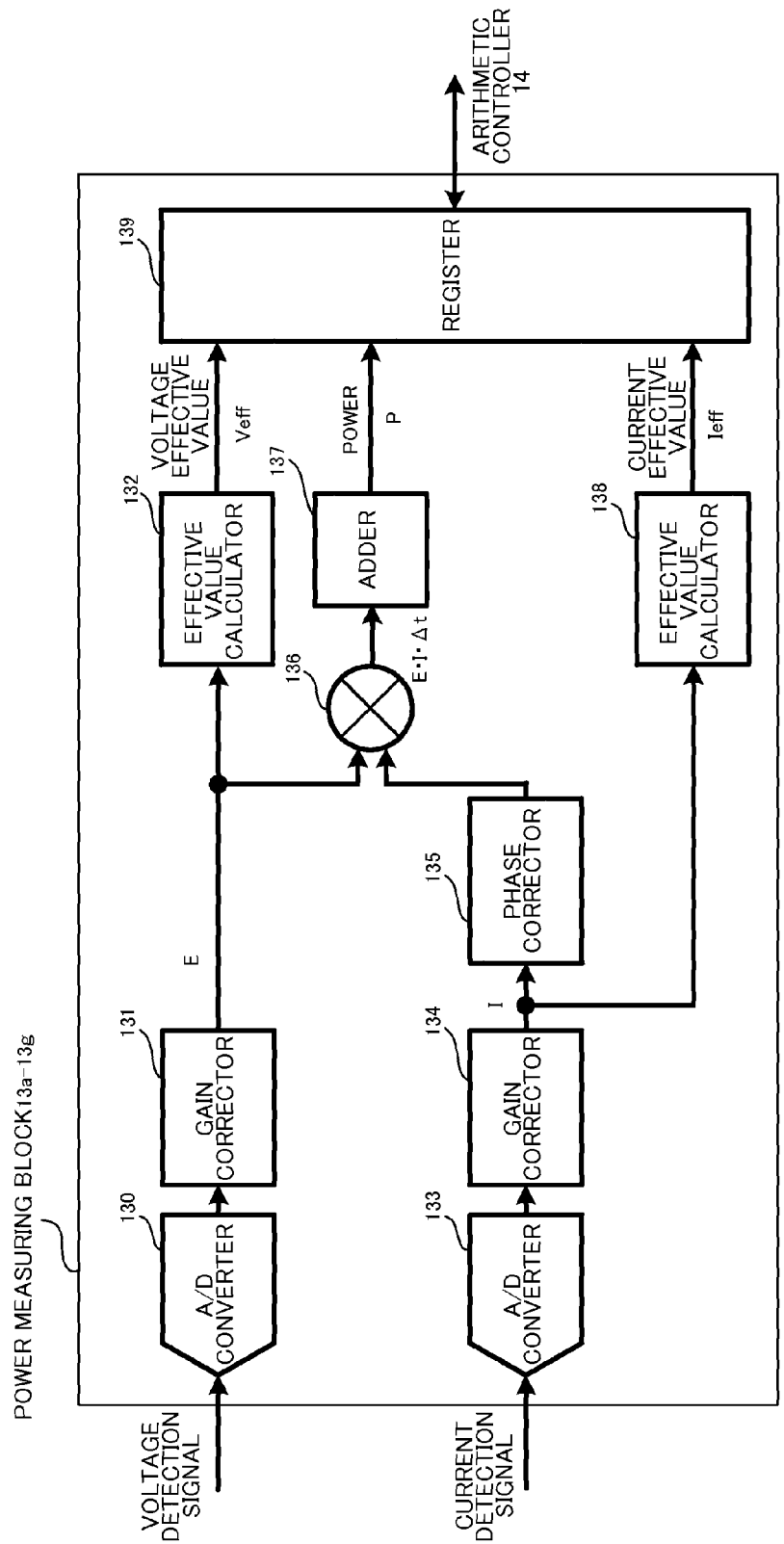
FIG. 6 is an internal structural diagram of the power measurer according to the embodiment of the present disclosure.

As illustrated in FIG. 6, the first power measuring block 13a to the seventh power measuring block 13g each include an A/D converter 130 that performs sampling on the voltage detection signal, a gain corrector 131 that corrects the output value by the A/D converter 130, and an effective value calculator 132 that acquires an effective value from the value of an applied voltage output by the gain corrector 131.

In addition, the first power measuring block 13a to the seventh power measuring block 13g each include an A/D converter 133 that performs sampling on the current detection signal, a gain corrector 134 that corrects the output value by the A/D converter 133, and a phase corrector 135 that corrects a phase difference between the voltage detection signal and the current detection signal.

Still further, the first power measuring block 13a to the seventh power measuring block 13g each include a multiplier 136 that multiplies the value of the applied voltage output by the gain corrector 131 by the value of the current output by the phase corrector 135, an adder 137 that acquires power P of the latest 1 second from the value output by the multiplier 136, an effective value calculator 138 that acquires an effective value from the value of the current output by the gain corrector 134, and a register 139 that stores the value acquired by the effective value calculator 132, the value acquired by the adder 137, and the value acquired by the effective value calculator 138.

More specifically, the A/D converter 130 performs sampling on the voltage detection signal supplied from the voltage measurer 11 to convert this signal into a digital signal, and output this digital signal.

The gain corrector 131 corrects the output value by the A/D converter 130 and acquires a value E that indicates the correct value of the applied voltage in order to correct the variability of the circuit constant of the voltage measurer 11 and that of the current measurer 12 and to acquire correct power.

The effective value calculator 132 squares the output (instantaneous value of applied voltage) E by the gain corrector 131 to acquire $E^2$, and accumulates the acquired $E^2$ for a cycle T of the applied voltage, thereby acquiring an accumulated value $\Sigma E^2$. The effective value calculator 132 acquires the square root $\sqrt{(\Sigma(E)^2)}$ of the accumulated value, and further divides by a number of samplings N for a cycle T to acquire $\sqrt{(\Sigma(E)^2)/N}$, thereby acquiring an effective value Veff of the applied voltage. The effective value calculator 132 acquires an average value of the acquired effective values Veff for a certain cycle, for example, a cycle of 1 second, and records the acquired average value in the register 139.

The A/D converter 133 performs sampling on the current detection signal supplied from the current measurer 12 to convert this signal into a digital signal, and outputs this digital signal.

The gain corrector 134 corrects the output value by the A/D converter 133 and acquires a value I that indicates the correct value of the current flowing through the equipment and the like in order to correct the variability of the circuit constant of the voltage measurer 11 and that of the current measurer 12 and to acquire correct power.

The phase corrector 135 corrects the phase difference caused due to a difference between the acquisition procedure of the voltage detection signal and that of the current detection signal with reference to the voltage detection signal. For example, the phase corrector 135 corrects a phase advancement or the like of the current detection signal due to the current transformer CT.

The multiplier 136 multiplies the value E indicating the voltage supplied from the gain corrector 131 by the value I (the value I produced at the same timing as the value E) having already undergone the phase correction and supplied from the phase corrector 135, thereby acquiring and outputting power E·I per a sampling time period. In addition, the multiplier 136 multiples the acquired E·I by a sampling cycle $\Delta t$, thereby acquiring E·I·$\Delta t$.

The adder 137 accumulates, for 1 second, the values E·I·$\Delta t$ output by the multiplier 136 to acquire the electric energy P for the latest 1 second, and records the acquired electric energy in the register 139.

The effective value calculator 138 squares the output (instantaneous value I of current) by the gain corrector 134 to acquire $I^2$, and accumulates the acquired $I^2$ for a cycle of the applied voltage, thereby acquiring an accumulated value $\Sigma I^2$. The effective value calculator 138 acquires the square root $\sqrt{(\Sigma I^2)}$ of the accumulated value, and further divides by a number of samplings N for a cycle T to acquire $\sqrt{(\Sigma I^2)}/N$, thereby acquiring an effective value Ieff of the current. The effective value calculator 138 acquires an average value of the acquired effective values Ieff for a certain cycle, for example, a cycle of 1 second, and records the acquired average value in the register 139.

The register 139 temporarily stores the voltage effective value Veff acquired by the effective value calculator 132, the electric energy P acquired by the adder 137, and the current effective value Ieff acquired by the effective value calculator 138, and provides the stored values in response to a request from the arithmetic controller 14.

The first power measuring block 13a illustrated in FIG. 2 acquires electric energy P1 supplied to the equipment connected with the indoor wiring through the power line L1 and the reference power line N, or the electric energy P1 supplied to the external load connected with the external line through the power line L1 and the reference power line N based on the voltage Va measured by the first voltage measuring block 11a, and the current I1 measured by the first current measuring block 12a by utilizing the structure illustrated in FIG. 6, and stores the acquired electric energy in the register 139.

In addition, the first power measuring block 13a acquires an effective value Vaeff of the voltage Va based on the voltage Va measured by the first voltage measuring block 11a, and an effective value I1eff of the current I1 based on the current I1 measured by the first current measuring block 12a, and, stores those acquired values in the register 139.

The second power measuring block 13b acquires electric energy P2 supplied to the equipment connected with the indoor wiring through the power line L2 and the reference power line N, or the electric energy P2 supplied to the external load connected with the external line through the power line L2 and the reference power line N based on the voltage Vb measured by the second voltage measuring block 11b, and the current I2 measured by the second current measuring block 12b by utilizing the structure illustrated in FIG. 6, and stores the acquired electric energy in the register 139.

In addition, the second power measuring block 13b acquires an effective value Vbeff of the voltage Vb based on the voltage Vb measured by the second voltage measuring block 11b, and an effective value I2eff of the current I2 based on the current I2 measured by the second current measuring block 12b, and, stores those acquired values in the register 139.

The third power measuring block 13c acquires electric energy P3 supplied from the solar power generation system 31 through the indoor wiring L1a and the reference indoor wiring Na based on the voltage Va measured by the first voltage measuring block 11a, and the current I3 measured by the third current measuring block 12c by utilizing the structure illustrated in FIG. 6, and stores the acquired electric energy in the register 139.

In addition, the third power measuring block 13c acquires the effective value Vaeff of the voltage Va based on the voltage Va measured by the first voltage measuring block 11a, and an effective value I3eff of the current I3 based on the current I3 measured by the third current measuring block 12c, and, stores those acquired values in the register 139.

The fourth power measuring block 13d acquires electric energy P4 supplied from the solar power generation system 31 through the indoor wiring L2a and the reference indoor wiring Na based on the voltage Vb measured by the second voltage measuring block 11b, and the current I4 measured by the fourth current measuring block 12d by utilizing the structure illustrated in FIG. 6, and stores the acquired electric energy in the register 139.

In addition, the fourth power measuring block 13d acquires the effective value Vbeff of the voltage Vb based on the voltage Vb measured by the second voltage measuring block 11b, and an effective value I4eff of the current I4 based on the current I4 measured by the fourth current measuring block 12d, and, stores those acquired values in the register 139.

The fifth power measuring block 13e acquires electric energy P5 supplied to the electricity storage system 32 through the indoor wiring L1a and the reference indoor wiring Na, or the electric energy P5 supplied from the electricity storage system 32 through the indoor wiring L1a and the reference indoor wiring Na based on the voltage Va measured by the first voltage measuring block 11a, and the current I5 measured by the fifth current measuring block 12e by utilizing the structure illustrated in FIG. 6, and stores the acquired electric energy in the register 139.

In addition, the fifth power measuring block 13e acquires the effective value Vaeff of the voltage Va based on the voltage Va measured by the first voltage measuring block 11a, and an effective value I5eff of the current I5 based on the current I5 measured by the fifth current measuring block 12e, and, stores those acquired values in the register 139.

The sixth power measuring block 13f acquires electric energy P6 supplied to the electricity storage system 32 through the indoor wiring L2a and the reference indoor wiring Na or the electric energy P6 supplied from the electricity storage system 32 through the indoor wiring L2a and the reference indoor wiring Na based on the voltage Vb measured by the second voltage measuring block 11b, and the current I6 measured by the sixth current measuring block 12f by utilizing the structure illustrated in FIG. 6, and stores the acquired electric energy in the register 139.

In addition, the sixth power measuring block 13f acquires the effective value Vbeff of the voltage Vb based on the voltage Vb measured by the second voltage measuring block 11b, and an effective value I6eff of the current I6 based on the current I6 measured by the sixth current measuring block 12f, and, stores those acquired values in the register 139.

The seventh power measuring block 13g acquires electric energy P7 supplied to the home equipment 33 through the indoor wiring L1a and the reference indoor wiring Na based on the voltage Va measured by the first voltage measuring block 11a, and the current I7 measured by the seventh current measuring block 12g by utilizing the structure illustrated in FIG. 6, and stores the acquired electric energy in the register 139.

In addition, the seventh power measuring block 13g acquires the effective value Vaeff of the voltage Va based on the voltage Va measured by the first voltage measuring block 11a, and an effective value I7eff of the current I7 based on the current I7 measured by the seventh current measuring block 12g, and, stores those acquired values in the register 139.

The arithmetic controller 14 determines whether the amounts of power measured by the first power measuring block 13a to the seventh power measuring block 13g, respectively, show the respective correct signs. When those amounts of power have the respective correct signs, the arithmetic controller 14 directly records and outputs the measured amounts of power. When the amounts of power don't have the respective correct signs, the arithmetic controller 14 does not output the amounts of power, but outputs information indicating the incorrect connection of the terminal T1 to T3 or information indicating the incorrect disposition of the current transformer CT1 to CT7 to, for example, the display (outputter 16).

Figure 7:
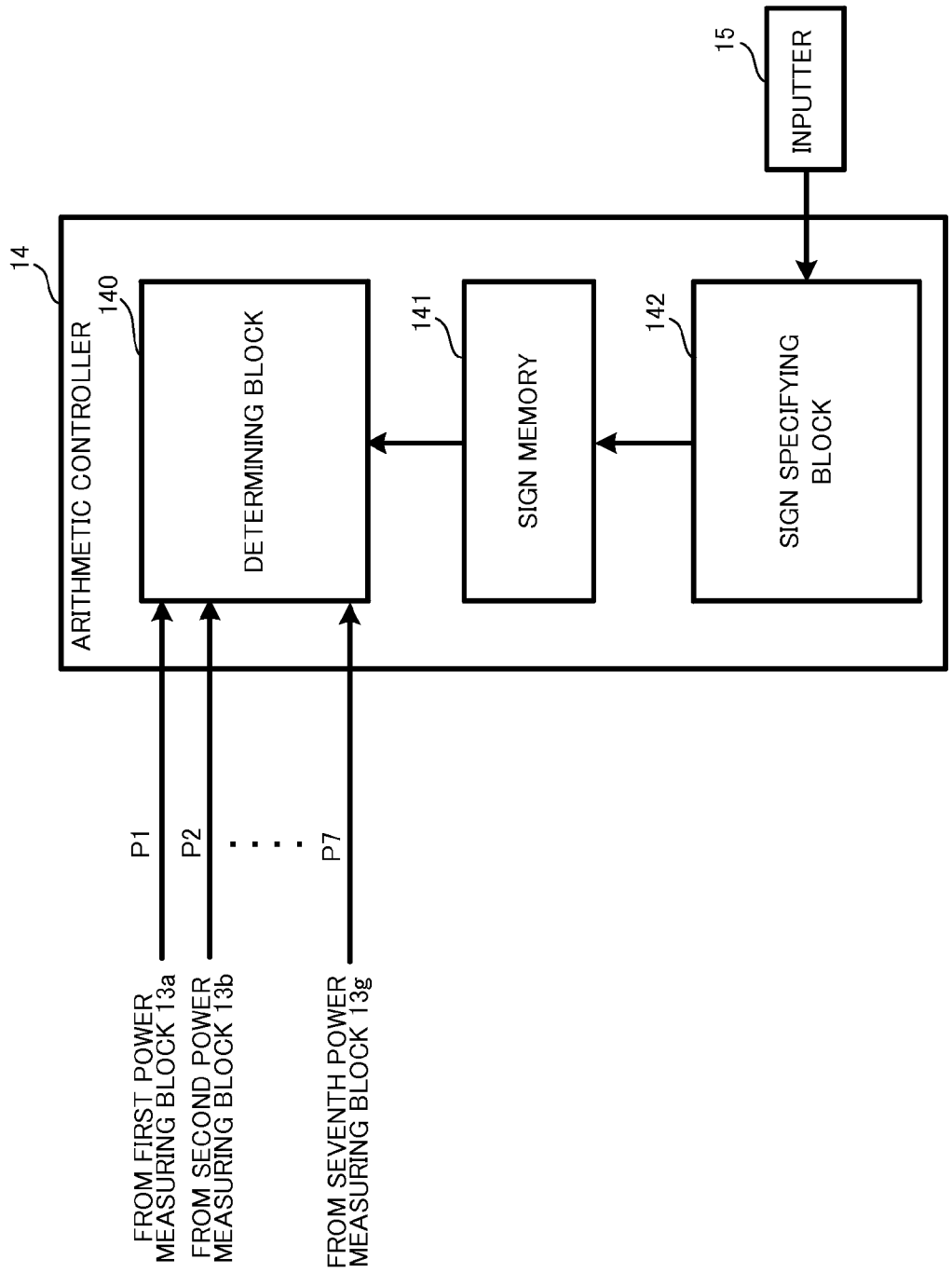
FIG. 7 is a block diagram of an arithmetic controller according to the embodiment of the present disclosure.

As illustrated in FIG. 7, the arithmetic controller 14 includes a determining block 140 that determines whether or not the current transformer CT1 to CT7 is connected in a correct direction, a sign memory 141 that stores sign information, and a sign specifying block 142 that creates the sign information.

More specifically, the determining block 140 includes a processor, and the like, and acquires the amounts of power P1 to P7 from the first power measuring block 13a to the seventh power measuring block 13g, respectively. In addition, the determining block 140 acquires, from the sign memory 141, the sign information indicating, when the terminals T1 to T3 are properly connected, and the current transformers CT1 to CT7 are correctly disposed, the acquired (measured) amounts of power P1 to P7 respectively show a positive sign, a negative sign, or both positive and negative signs. Next, the determining block 140 compares the signs of the acquired (measured) amounts of power P1 to P7 with the respective signs of the amounts of power indicated by the sign information, and determines whether or not the respective current transformers CT1 to CT7 are disposed on the outer circumference of the power line in the correct direction. In addition, the determining block 140 determines whether or not the electric energy supplied to, through the power lines L1, N, and L2, the external load connected with the external line is equal to or smaller than the electric energy supplied from the solar power generation system 31 or the electricity storage system 32, or, is equal to or smaller than the total value of the electric energy supplied from the solar power generation system 31 and the electric energy supplied from the electricity storage system 32, thereby determining whether or not the respective current transformers CT1 to CT7 are disposed on the outer circumferences of the power lines in the correct direction. Those determination operations will be explained later in more detail.

The determining block 140 directly records and outputs the acquired amounts of power P1 to P7 or does not output the acquired amounts of power P1 to P7 but outputs information indicating the incorrect disposition according to the determination result.

The sign memory 141 stores the sign information created by the sign specifying block 142.

The sign specifying block 142 includes a processor, and the like, and stores a sign table to create the sign information. The sign table associates information on whether the electric energy measured by the power measurer 13 when the current transformer CT is correctly disposed shows a positive sign, a negative sign or both signs with information indicating the power line where the current transformer CT is disposed. The sign table is stored in the sign specifying block 142 by the system constructor or the user beforehand.

For example, as illustrated in FIG. 8, the sign table associates information indicating the power lines L1 and L2 connected with the master breaker 35 with, information indicating that the measured electric energy shows both signs that are a positive sign and a negative sign. In addition, the sign table associates information indicating the indoor wirings L1b and L2b connected with the solar power generation system 31 with, information indicating that the measured electric energy shows a negative sign.

Still further, the sign table associates information indicating the indoor wirings L1c and L2c connected with the electricity storage system 32 with, information indicating that the measured electric energy shows both signs that are a positive sign and a negative sign. Yet still further, the sign table associates information indicating an indoor wiring L1d connected with the home equipment 33 with, information indicating that the measured amount power shows a positive sign.

How the sign specifying block 142 utilizes the sign table will be explained. When, for example, the system constructor manipulates the inputter 15 that is a DIP switch (or keyboard), and inputs disposition information indicating which current transformer CT is disposed and on which power line (indoor wiring) such a current transformer is disposed, the sign specifying block 142 operates as follow. The sign specifying block 142 specifies, for each name of electric energy P1 to P7 (for each name of current transformer CT), whether the electric energy measured by the power measurer 13 shows a positive sign, a negative sign, or both signs when such a current transformer CT is correctly disposed based on the input disposition information and the sign table. Next, the sign specifier 142 associates the specified sign with the name of electric energy P1 to P7 to create the sign information, and stores the created sign information in the sign memory 141.

For example, as illustrated in FIG. 9, it is assumed that the system constructor inputs disposition information indicating that the current transformer CT1 is disposed on the outer circumference of the power line L1 connected with the master breaker 35, and disposition information indicating that the current transformer CT2 is disposed on the outer circumference of the power line L2 connected with the master breaker 35.

In addition, for example, as illustrated in FIG. 9, it is assumed that the system constructor inputs disposition information indicating that the current transformer CT3 is disposed on the outer circumference of the indoor wiring L1b connected with the solar power generation system 31, and disposition information indicating that the current transformer CT4 is disposed on the outer circumference of the indoor wiring L2b connected with the solar power generation system 31.

Still further, for example, as illustrated in FIG. 9, it is assumed that the system constructor inputs disposition information indicating that the current transformer CT5 is disposed on the outer circumference of the indoor wiring L1c connected with the electricity storage system 32, and disposition information indicating that the current transformer CT6 is disposed on the outer circumference of the indoor wiring L2c connected with the electricity storage system 32.

Yet still further, for example, as illustrated in FIG. 9, it is assumed that the system constructor inputs disposition information indicating that the current transformer CT7 is disposed on the outer circumference of the indoor wiring L1d connected with the home equipment 33.

In this case, when, as illustrated in FIG. 10, the current transformers CT are correctly disposed, the sign specifying block 142 specifies, based on the disposition information illustrated in FIG. 9 and the sign table illustrated in FIG. 8, the amounts of power P1, P2 show both signs. In addition, the sign specifying block 142 specifies that the amounts of power P3, P4 show a negative sign, the amounts of power P5, P6 show both signs, and the electric energy P7 shows a positive sign.

More specifically, when, for example, specifying the sign of the electric energy P1 (sign of current measured through current transformer CT1), first, the sign specifying block 142 extracts, from the disposition information illustrated in FIG. 9, information indicating that the current transformer CT1 is disposed on the outer circumference of the power line L1 connected with the master breaker 35. Next, the sign specifying block 142 searches, from the sign table, information indicating the "power lines L1, L2 of the master breaker 35" including the disposition location which matches with the disposition location of the current transformer CT1 which is the power line L1. Subsequently, the sign specifying block 142 specifies, from the sign table, the sign "positive or negative" of the electric energy associated with the searched disposition location that is the "power lines L1, L2 of the master breaker 35". Hence, when the current transformer CT1 is correctly disposed, the sign specifying block 142 specifies that the measured electric energy P1 shows both signs (specifies that electric energy acquired from current measured through current transformer CT1 shows both signs).

In addition, when, for example, specifying the sign of the electric energy P3 (sign of current measured through current transformer CT3), first, the sign specifying block 142 extracts, from the disposition information illustrated in FIG. 9, information indicating that the current transformer CT3 is disposed on the outer circumference of the power line L1b connected with the solar power generation system 31. Next, the sign specifying block 142 searches, from the sign table, information indicating the "power lines L1b, L2b of the solar power generation system 31" including the disposition location which matches with the disposition location of the current transformer CT3 which is the power line L1b. Subsequently, the sign specifying block 142 specifies, from the sign table, the sign "negative" of the electric energy associated with the searched disposition location that is the "power lines L1b, L2b of the solar power generation system 31". Hence, when the current transformer CT3 is correctly disposed, the sign specifying block 142 specifies that the measured electric energy P3 shows the negative sign (specifies that electric energy acquired from current measured through current transformer CT3 shows the negative sign).

The sign specifying block 142 associates the specified sign with the name of electric energy (corresponding to name of current transformer CT) to create the sign information, and stores this sign information in the sign memory 141.

In addition, the sign memory 141 stores a program that realizes operations to be explained later with reference to FIG. 11 and FIG. 12. The program is stored by the system constructor or the user beforehand. Still further, the sign memory 141 stores the value of the electric energy, that of the effective value, and the like (value stored in register 139) acquired by the power measurer 13.

The inputter 15 is a DIP switch or a keyboard. The system constructor manipulates the DIP switch or the keyboard to input the disposition information indicating which current transformer CT is disposed and on which power line (indoor wiring) such a current transformer is disposed.

The outputter 16 is, for example, a display. The determining block 140 compares the sign of the acquired electric energy P1 to P7 with the sign of the electric energy indicated in the sign information, and when those signs are inconsistent with each other, the determining block displays, on the outputter 16, information indicating that the current transformer CT1 to CT7 is disposed incorrectly. Hence, the system constructor or the user is notified of the incorrect disposition of the current transformer CT1 to CT7. In addition, when the terminals T1 to T3 are connected properly, and the current transformers CT1 to CT7 are correctly disposed (when information indicating incorrect disposition of current transformer CT1 to CT7 is not displayed), the arithmetic controller 14 displays, on the outputter 16, the amounts of power P1 to P7 measured by the power measurer 13 (the amounts of power P1 to P7 stored in register 139).

Next, an explanation will be given of an operation of the power measurement device 10 employing the above structure.

After the system constructor of the power measurement device 10 connects the terminals T1 to T3 to the indoor wirings L1a, N, and L2a, and disposes the current transformers CT1 to CT7 on the outer circumferences of the power lines L1, L2 and the outer circumferences of the distribution lines L1b, L1c, L1d, L2b, and L2c, this system constructor instructs a creation of the sign information (information associating name of electric energy with sign of electric energy) by manipulating the inputter 15. This causes the arithmetic controller 14 to start a sign information creating process illustrated in FIG. 11.

In the sign information creating process, the arithmetic controller 14 (sign specifying block 142) displays (step S1), on the outputter 16 that is, for example, the display, a request for inputting the disposition information (which current transformer CT is disposed and on which power line (or indoor wiring) such a current transformer is disposed).

Next, the arithmetic controller 14 (sign specifying block 142) determines (step S2) whether or not all disposition locations of the current transformers CT are input. When, for example, a manipulation indicating the completion of the inputting of all disposition locations of the current transformers CT is not accepted through the inputter 15, the arithmetic controller 14 (sign specifying block 142) determines (step S2: NO) that all disposition locations of the current transformers CT have not been input yet, and returns the process to the step S1.

Conversely, when, for example, a manipulation indicating the completion of the inputting of all disposition locations of the current transformers CT is accepted through the inputter 15, the arithmetic controller 14 (sign specifying block 142) determines (step S2: YES) that all disposition locations are input.

When the determination result in the step S2 is YES, the arithmetic controller 14 (sign specifying block 142) selects (step S3) one of the input disposition locations. Next, the arithmetic controller 14 (sign specifying block 142) searches (step S3), from the sign table stored in the sign memory 141 beforehand (table indicating whether electric energy measured by power measurer 13 when current transformer CT is correctly disposed shows positive sign, negative sign or both signs), the disposition location matching the selected disposition location.

Next, the arithmetic controller 14 (sign specifying block 142) specifies (step S4), from the sign table, the sign of the electric energy associated with the searched disposition location.

When, for example, the system constructor inputs the disposition information illustrated in FIG. 9 and the sign table illustrated in FIG. 8 is stored in the sign memory 141, the arithmetic controller 14 (sign specifying block 142) extracts, in the step S3, information indicating that, for example, the current transformer CT1 is disposed on the outer circumference of the power line L1 of the master breaker 35. Next, the arithmetic controller 14 (sign specifying block 142) searches, from the sign table, information indicating the "power lines L1, L2 of the master breaker 35" containing the disposition location matching the power line L1 that is the disposition location of the current transformer CT1. Subsequently, the arithmetic controller 14 (sign specifying block 142) specifies, from the sign table, the sign "positive or negative" of the electric energy associated with the searched disposition locations that are the "power lines L1, L2 of the master breaker 35". Hence, when the current transformer CT1 is correctly disposed, the arithmetic controller 14 (sign specifying block 142) specifies that the measured electric energy P1 shows both signs (specifies that electric energy acquired from current measured through current transformer CT1 shows both signs).

In addition, when, for example, the system constructor inputs the disposition information illustrated in FIG. 9 and the sign table illustrated in FIG. 8 is stored in the sign memory 141, the arithmetic controller 14 (sign specifying block 142) extracts, in the step S3, information indicating that, for example, the current transformer CT7 is disposed on the outer circumference of the indoor wiring L1$d$ of the home equipment 33. Next, the arithmetic controller 14 (sign specifying block 142) searches, from the sign table, information indicating the "indoor wiring L1$d$ of the home equipment 33" containing the disposition location matching the indoor wiring L1$d$ that is the disposition location of the current transformer CT7. Subsequently, the arithmetic controller 14 (sign specifying block 142) specifies, from the sign table, the sign "positive" of the electric energy associated with the searched disposition location that is the "indoor wiring L1$d$ of the home equipment 33". Hence, when the current transformer CT7 is correctly disposed, the arithmetic controller 14 (sign specifying block 142) specifies that the measured electric energy P7 shows the positive sign (specifies that electric energy acquired from current measured through current transformer CT7 shows the positive sign).

After the execution of the step S4, the arithmetic controller 14 (sign specifying block 142) creates (step S5) the sign information that associates the specified sign of the electric energy with the name of electric energy (corresponding to name of current transformer CT).

When, for example, specifying that the sign of the electric energy P1 is positive or negative based on the disposition location of the current transformer CT1, as illustrated in FIG. 10, the arithmetic controller 14 (sign specifying block 142) creates the sign information that associates "electric energy P1" that is the name of electric energy with the sign of the electric energy that is "positive or negative".

In addition, when, for example, specifying that the sign of the electric energy P7 is positive based on the disposition location of the current transformer CT7, as illustrated in FIG. 10, the arithmetic controller 14 (sign specifying block 142) creates the sign information that associates "electric energy P7" which is the name of electric energy with the sign of the electric energy which is "positive".

After the execution of the step S5, the arithmetic controller 14 (sign specifying block 142) determines (step S6) whether or not the signs of the amounts of power are specified for the respective input disposition locations of all current transformers CT. When determining (step S6: NO) that the signs of the amounts of power have not been specified yet for the respective input disposition locations of all current transformers CT, the arithmetic controller 14 (sign specifying block 142) returns the process to the step S3.

Conversely, when determining (step S6: YES) that the signs of the amounts of power are specified for the respective input disposition locations of all current transformers CT, the arithmetic controller 14 (sign specifying block 142) stores the created sign information in the sign memory 141 (step S7), and terminates this sign information creating process.

After the completion of the sign information creating process, the first voltage measuring block 11$a$ steps down the first-phase voltage Va between the power line L1 and the reference power line N, and creates the voltage detection signal. The first voltage measuring block 11$a$ outputs the created voltage detection signal to the first power measuring block 13$a$, the third power measuring block 13$c$, the fifth power measuring block 13$e$, and the seventh power measuring block 13$g$. In addition, the second voltage measuring block 11$b$ steps down the second-phase voltage Vb between the reference power line N and the second power line L2, and creates the voltage detection signal. The second voltage measuring block 11$b$ outputs the created voltage detection signal to the second power measuring block 13$b$, the fourth power measuring block 13$d$, and the sixth power measuring block 13$f$.

In addition, the first current measuring block 12$a$ measures, through the current transformer CT1, the current I1 that flows from the power line L1 to the master breaker 35. The first current measuring block 12$a$ creates the current detection signal that indicates the current value, and outputs the created signal to the first power measuring block 13$a$. The second current measuring block 12$b$ measures, through the current transformer CT2, the current I2 that flows from the power line L2 to the master breaker 35. The second current measuring block 12$b$ creates the current detection signal that indicates the current value, and outputs the created signal to the second power measuring block 13$b$.

The third current measuring block 12$c$ measures, through the current transformer CT3, the current I3 that flows from the solar power generation system 31 to the indoor wiring L1$a$. The third current measuring block 12$c$ creates the current detection signal that indicates the current value, and outputs the created signal to the first power measuring block 13$a$. The fourth current measuring block 12$d$ measures, through the current transformer CT4, the current I4 that flows from the solar power generation system 31 to the indoor wiring L2$a$. The fourth current measuring block 12$d$ creates the current detection signal that indicates the current value, and outputs the created signal to the second power measuring block 13$b$.

The fifth current measuring block 12$e$ measures, through the current transformer CT5, the current I5 that flows from the electricity storage system 32 to the indoor wiring L1$a$. The fifth current measuring block 12$e$ creates the current detection signal that indicates the current value, and outputs the created signal to the first power measuring block 13$a$. The sixth current measuring block 12$f$ measures, through the current transformer CT6, the current I6 that flows from the electricity storage system 32 to the indoor wiring L2$a$. The sixth current measuring block 12$f$ creates the current detection signal that indicates the current value, and outputs the created signal to the second power measuring block 13$b$.

The seventh current measuring block 12$g$ measures, through the current transformer CT7, the current I7 that flows from the indoor wiring L1$a$ to the home equipment 33. The seventh current measuring block 12$g$ creates the current detection signal that indicates the current value, and outputs the created signal to the first power measuring block 13$a$.

The first power measuring block 13$a$ performs sampling on the voltage detection signal that indicates the voltage value of the voltage Va measured by the first voltage measuring block 11$a$, and, the current detection signal that indicates the current value of the current I1 measured by the first current measuring block 12a. The first power measuring block 13a acquires electric energy Va·I1·Δt per a sampling time period Δt, accumulates the acquired values, and acquires an accumulated value (electric energy) P1 at a cycle of 1 second. In addition, the first power measuring block 13a acquires the effective value Vaeff of the voltage Va and the effective value I1eff of the current I1. Next, the first power measuring block 13a stores those values in the register 139.

The second power measuring block 13b performs sampling on the voltage detection signal that indicates the voltage value of the voltage Vb measured by the second voltage measuring block 11b, and, the current detection signal that indicates the current value of the current I2 measured by the second current measuring block 12b. The second power measuring block 13b acquires electric energy Vb·I2·Δt per the sampling time period Δt, accumulates the acquired values, and acquires an accumulated value (electric energy) P2 at the cycle of 1 second. In addition, the second power measuring block 13b acquires the effective value Vbeff of the voltage Vb and the effective value I2eff of the current I2. Next, the second power measuring block 13b stores those values in the register 139.

Likewise, the third power measuring block 13c acquires the electric energy P3, the effective value Vaeff of the voltage Va, and the effective value I3eff of the current I3, and stores those values in the register 139. The fourth power measuring block 13d acquires the electric energy P4, the effective value Vbeff of the voltage Vb, and the effective value I4eff of the current I4, and stores those values in the register 139.

In addition, the fifth power measuring block 13e acquires the electric energy P5, the effective value Vaeff of the voltage Va, and the effective value I5eff of the current I5, and stores those values in the register 139. The sixth power measuring block 13f acquires the electric energy P6, the effective value Vbeff of the voltage Vb, and the effective value I6eff of the current I6, and stores those values in the register 139.

Still further, the seventh power measuring block 13g acquires the electric energy P7, the effective value Vaeff of the voltage Va, and the effective value I7eff of the current I7, and stores those values in the register 139.

Subsequently, it is assumed that the system constructor of the power measurement device 10 instructs the determination on the respective connections of the terminals T1 to T3, and the determination on the respective dispositions of the current transformers CT1 to CT7 by manipulating the inputter 15. This causes the arithmetic controller 14 to start a determining process illustrated in FIG. 12.

In the determining process, the arithmetic controller 14 (determining block 140) acquires (step S11), from the register 139 of the power measurer 13, the effective values Vaeff, Vbeff of the voltages, the effective values I1eff to I7eff of the currents, and the amounts of power P1 to P7.

Next, the arithmetic controller 14 (determining block 140) determines (step S12) whether or not the acquired effective values Vaeff, Vbeff of the voltages are within a set range (for example, ±3% relative to a reference voltage value).

When the terminal T1 is connected to the indoor wiring L1a, the terminal T2 is connected to the reference indoor wiring Na, and the terminal T3 is connected to the indoor wiring L2a, since the voltage between the terminals T1 and T2 is Va, and the voltage between the terminals T2 and T3 is Vb, the effective values Vaeff, Vbeff of the voltages fall into values within the predetermined range. Hence, the arithmetic controller 14 (determining block 140) determines in the step S12 as YES. In this case, the arithmetic controller 14 (determining block 140) transitions the process to a process after step S14 of determining whether or not the current transformers CT1 to CT7 are disposed in the respective correct directions.

Conversely, when, for example, the terminal T1 is connected to the indoor wiring L1a, the terminal T3 is connected to the reference indoor wiring Na, and the terminal T2 is connected to the indoor wiring L2a, since the voltage between the terminals T1 and T2 is Va+Vb, the effective value Vaeff of the voltage becomes out of the predetermined range. Hence, the arithmetic controller 14 (determining block 140) determines in the step S12 as NO. In this case, the arithmetic controller 14 (determining block 140) displays (step S13), on the outputter 16 that is the display, a screen indicating that, for example, the terminal T1 to T3 is incorrectly connected. Through the notification by this screen, the system constructor or the user can recognize that there is a incorrect connection of the terminal T1 to T3.

When determining as YES in the step S12, the arithmetic controller 14 (determining block 140) specifies (step S14), from the sign information stored in the sign memory 141 and among the symbols of the amounts of power indicated by the sign information, the electric energy that has the simplex sign (either positive or negative).

When, for example, the sign information illustrated in FIG. 10 is stored in the sign memory 141, the arithmetic controller 14 (determining block 140) specifies, in the step S14, the amounts of power P3, P4, and P7 which have respective simplex signs.

Next, the arithmetic controller 14 (determining block 140) determines (step S15) whether or not the signs of the amounts of power specified in the step S14 are all consistent with the signs of the amounts of power acquired in the step S11.

When, for example, the arithmetic controller 14 (determining block 140) specifies in the step S14 that the amounts of power P3, P4, and P7 have the respective simplex signs from the sign information, the arithmetic controller determines in the step S15 whether or not the respective signs of the amounts of power P3, P4, and P7 indicated in the sign information are all consistent with the respective signs of the amounts of power P3, P4, and P7 acquired in the step S11.

When determining (step S15: NO) that at least a specified sign of the electric energy is inconsistent with the sign of the electric energy acquired in the step S11, the arithmetic controller 14 (determining block 140) displays (step S23), on the outputter 16 that is the display, a screen indicating that the current transformer CT is incorrectly disposed. Through the notification by this screen, the system constructor or the user can recognize that there is an incorrect disposition of the current transformer CT.

When determining (step S15: YES) that all specified signs of the amounts of power are consistent with the signs of the amounts of power acquired in the step S11, the arithmetic controller 14 (determining block 140) transitions the process to a process after step S16 of determining the respective dispositions of the current transformer CT to measure the electric energy that indicates both signs which are the positive and negative signs.

In step S16, the arithmetic controller 14 (determining block 140) specifies, from the disposition information of the current transformer CT input by the system constructor, to which one of the amounts of power P1 to P7 acquired in the step S11 the electric energy supplied through the master breaker 35 corresponds (step S16).

When, for example, as illustrated in FIG. 9, the system constructor inputs the disposition information indicating that the current transformer CT1 is disposed on the outer circumference of the power line L1 of the master breaker 35, and the current transformer CT2 is disposed on the outer circumference of the power line L2 of the master breaker 35, the arithmetic controller 14 (determining block 140) specifies in the step S16 that the amounts of power P1, P2 are the amounts of power supplied through the master breaker 35.

Subsequently, the arithmetic controller 14 (determining block 140) determines (step S17) whether or not the electric energy supplied through the master breaker 35 (electric energy acquired in step S11, that is, measured value) shows a negative sign.

When, for example, the arithmetic controller 14 (determining block 140) specifies in the step S16 that the amounts of power P1, P2 are the amounts of power supplied through the master breaker 35, the arithmetic controller determines in the step S17 whether or not the respective signs of the amounts of power P1, P2 (sign of electric energy acquired in step S11) show the negative sign. Through this process, the arithmetic controller 14 (determining block 140) determines whether or not, through the power lines L1, N, and L2, power is supplied to the external load connected with the external line. The arithmetic controller 14 (determining block 140) that executes the step S16 corresponds to a current determined as recited in appended claims.

When determining (step S17: YES) that the electric energy supplied through the master breaker 35 (electric energy acquired in step S11) shows the negative sign, the arithmetic controller 14 (determining block 140) specifies (step S18), from the electric energy acquired in the step S11, the electric energy other than the electric energy supplied through the master breaker 35 based on the sign information stored in the sign memory 141.

When, for example, the arithmetic controller 14 (determining block 140) specifies in the step S16 that the amounts of power P1, P2 are the amounts of power supplied through the master breaker 35, and the sign information illustrated in FIG. 10 is stored in the sign memory 141, the arithmetic controller specifies in the step S18 that the amounts of power P3, P4, P5, P6, and P7 correspond to the amounts of power other than the electric energy supplied through the master breaker 35.

Subsequently, the arithmetic controller 14 (determining block 140) specifies (step S19), from the electric energy acquired in the step S11, the electric energy that shows the negative sign among the specified amounts of power in the step S18.

When, for example, the arithmetic controller 14 (determining block 140) specifies in the step S18 the amounts of power P3, P4, P5, P6, and P7, the arithmetic controller further specifies the electric energy that shows the negative sign among the amounts of power P3, P4, P5, P6, and P7 acquired in the step S11. Through this specifying operation, the arithmetic controller 14 (determining block 140) becomes possible to specify which one of the solar power generation system 31 and the electricity storage system 32 is the equipment that supplies power (becomes possible to specify to which power line the equipment outputs a current). The arithmetic controller 14 (determining block 140) that executes the step S18 corresponds to a specifier as recited in appended claims.

Subsequently, the arithmetic controller 14 (determining block 140) totals (step S20), for each phase, the amounts of power showing the negative sign specified in the step S19.

When, for example, the arithmetic controller 14 (determining block 140) specifies in the step S19 the amounts of power P3, P4, P5, and P6, the electric energy P3 and the electric energy P5 are the amounts of power based on the first-phase voltage Va, while the electric energy P4 and the electric energy P6 are the amounts of power based on the second-phase voltage Vb. Hence, the arithmetic controller 14 (determining block 140) acquires in the step S20 the total value of the electric energy P3 acquired in the step S11 and the electric energy P5 acquired in the step S11, and, the total value of the electric energy P4 acquired in the step S11 and the electric energy P6 acquired in the step S11.

Subsequently, the arithmetic controller 14 (determining block 140) determines (step S21) whether or not, in all phases, a condition in which the electric energy supplied through the master breaker 35 (specified based on electric energy acquired in step S11)≤the total value (specified based on electric energy acquired in step S11) is satisfied. The arithmetic controller 14 (determining block 140) that executes the step S21 corresponds to a total value determiner as recited in appended claims.

When, for example, the arithmetic controller 14 (determining block 140) specifies in the step S16 that the amounts of power P1, P2 are the amounts of power supplied through the master breaker 35 and acquires in the step S20 the total value of the electric energy P3 and the electric energy P5, and, the total value of the electric energy P4 and the electric energy P6, the following determination is performed. The arithmetic controller 14 (determining block 140) determines whether or not a relationship that is the electric energy P1 corresponding to the first-phase voltage Va≤the total value of the electric energy P3 and the electric energy P5 is satisfied, and a relationship that is the electric energy P2 corresponding to the second-phase voltage Vb≤the total value of the electric energy P4 and the electric energy P6 is satisfied. This process enables the arithmetic controller 14 (determining block 140) to determine whether or not the following general rule is satisfied. That is, the arithmetic controller 14 (determining block 140) is capable of determining whether or not the general rule in which the electric energy supplied to the external load through the power lines L1, N, and L2 is equal to or smaller than the electric energy supplied from the solar power generation system 31 and the electricity storage system 32 since there is a fact that power supplied from the solar power generation system 31 and the electricity storage system 32 is consumed by at least the home equipment 33.

When determining (step S21: YES) that, in all phases, the condition in which the electric energy supplied through the master breaker 35 (specified based on electric energy acquired in step S11)≤the total value (specified based on electric energy acquired in step S11) is satisfied, the arithmetic controller 14 (determining block 140) determines that all current transformers CT are correctly disposed since the above general rule is satisfied.

Conversely, when determining (step S21: NO) that, in at least a phase, the condition in which the electric energy supplied through the master breaker 35 (specified based on electric energy acquired in step S11)≤the total value (specified based on electric energy acquired in step S11) is unsatisfied, the arithmetic controller 14 (determining block 140) displays (step S23), on the outputter 16 that is the display, the screen indicating that the current transformer CT is incorrectly disposed. The arithmetic controller 14 (determining block 140) that executes the step S21: NO, and the step S23 corresponds to an incorrect disposition determiner as recited in appended claims.

When, for example, although the current transformers CT1, CT2, CT3, and CT4 are disposed in the respective correct directions, the current transformers CT5, CT6 are disposed in the opposite directions, and when power is supplied from the electricity storage system 32, the amounts of power P5, P6 show a positive sign. Hence, the arithmetic controller 14 (determining block 140) specifies in the step S19 the amounts of power P3, P4 (and does not specify amounts of power P5, P6).

At this time, when the amounts of power P3 and P4 supplied from the solar power generation system 31 are 2 kw, the amounts of power P5 and P6 supplied from the electricity storage system 32 are 1 kw, and the electric energy P7 consumed by the home equipment 33 is 0.5 kw, the amounts of power P1 and P2 supplied to the external load through the external line should be 2.5 kw.

However, since the current transformers CT5, CT6 are disposed in the opposite directions, the arithmetic controller 14 (determining block 140) acquires in the step S20 the electric energy P3 corresponding to the first-phase voltage Va as the total value, and also acquires the electric energy P4 corresponding to the second-phase voltage Vb as the total value.

Hence, the arithmetic controller 14 (determining block 140) determines in the step S21 that the condition in which the electric energy P1>the electric energy P3 and the electric energy P2>the electric energy P4 is satisfied (step S21: NO). Subsequently, the arithmetic controller 14 (determining block 140) displays (step S23), on the outputter 16 that is the display, a screen indicating that the current transformer CT is incorrectly disposed. By visually checking this screen, the system constructor or the user can recognize that there is an incorrect disposition of the current transformer CT.

In addition, when, for example, although the current transformers CT3, CT4, CT5, and CT6 are disposed in the respective correct directions, the current transformers CT1, CT2 are disposed in the opposite directions, and when power is supplied to the equipment through the indoor wirings from the external line, the amounts of power P1, P2 show a negative sign.

At this time, when the amounts of power P3 and P4 supplied from the solar power generation system 31 are 1 kw, the amounts of power P5 and P6 supplied from the electricity storage system 32 are 0.5 kw, and the electric energy P7 consumed by the home equipment 33 is 4 kw, the amounts of power P1 and P2 supplied to the equipment through the indoor wirings should be 2.5 kw.

In this case, since the current transformers CT3, CT4, CT5, and CT6 are disposed in the respective correct directions, the arithmetic controller 14 (determining block 140) acquires the total value that is the electric energy P3+the electric energy P5, and also the total value that is the electric energy P4+the electric energy P6. Next, the arithmetic controller 14 (determining block 140) compares the amounts of power P1, P2 when power is supplied to the equipment through the indoor wirings with the total value.

Hence, the arithmetic controller 14 (determining block 140) determines in the step S21 that the condition in which the electric energy P1>the electric energy P3+the electric energy P5 and the electric energy P2>the electric energy P4+the electric energy P6 is satisfied (step S21: NO). Subsequently, the arithmetic controller 14 (determining block 140) displays (step S23), on the outputter 16 that is the display, a screen indicating that the current transformer CT is incorrectly disposed. By visually checking this screen, the system constructor or the user can recognize that there is an incorrect disposition of the current transformer CT.

Still further, when, for example, although the current transformers CT3, CT4 are disposed in the respective correct directions, the current transformers CT1, CT2 are disposed in the opposite directions and the current transformers CT5, CT6 are also disposed in the opposite directions, and, when power is supplied to the equipment through the indoor wirings, the amounts of power P1, P2 show a negative sign, and, when power is supplied from the electricity storage system 32, the amounts of power P5, P6 show a positive sign.

At this time, when the amounts of power P3 and P4 supplied from the solar power generation system 31 are 1 kw, the amounts of power P5 and P6 supplied from the electricity storage system 32 are 0.5 kw, and the electric energy P7 consumed by the home equipment 33 is 4 kw, the amounts of power P1 and P2 supplied to the equipment through the indoor wirings should be 2.5 kw.

At this time, since the current transformers CT5, CT6 are disposed in the opposite directions, the arithmetic controller 14 (determining block 140) acquires in the step S20 the electric energy P3 corresponding to the first-phase voltage Va as the total value, and the electric energy P4 corresponding to the second-phase voltage Vb as the total value.

In addition, the arithmetic controller 14 (determining block 140) compares the amounts of power P1, P2 when power is supplied to the equipment through the indoor wiring with the total value.

Hence, the arithmetic controller 14 (determining block 140) determines in the step S21 that the condition in which the electric energy P1>the electric energy P3 and the electric energy P2>the electric energy P4 is satisfied (step S21: NO). Subsequently, the arithmetic controller 14 (determining block 140) displays (step S23), on the outputter 16 that is the display, a screen indicating that the current transformer CT is incorrectly disposed. By visually checking this screen, the system constructor or the user can recognize that there is an incorrect disposition of the current transformer CT.

When determining (step S17: NO) that the electric energy supplied through the master breaker 35 and acquired in the step S11 shows a positive sign, the arithmetic controller 14 (determining block 140) terminates this determining process since it is unable for the arithmetic controller to determine the disposition of the current transformer CT in order to measure the electric energy that shows both positive and negative signs.

As explained above, the power measurement device 10 of this embodiment specifies, from the sign information, the electric energy that shows a simplex sign (either positive or negative) among the signs of the amounts of power indicated by the sign information stored in the sign memory 141, and determines whether or not the specified signs of the respective amounts of power all match the signs of the respective amounts of power acquired in the step S11. Based on this determination result, the power measurement device 10 determines whether or not the current transformers CT are disposed in the respective correct directions. Hence, even if, in addition to the equipment to which power is supplied, the equipment that supplies power (equipment that may produce reverse tidal current) is connected with a power line, the power measurement device 10 is capable of determining the incorrect disposition of the current transformer CT. In addition, even if, in addition to the equipment to which power is supplied, the equipment that supplies power (equipment that may produce reverse tidal current) is connected with a power line, the power measurement device 10 of this embodiment is capable of measuring electric energy.

Still further, the power measurement device 10 of this embodiment specifies the electric energy supplied through the master breaker 35 and the electric energy other than the electric energy supplied through the master breaker 35. Next, the power measurement device 10 acquires a total value of the amounts of power other than the electric energy supplied through the master breaker 35. Subsequently, the power measurement device 10 determines whether or not the electric energy supplied through the master breaker 35 is equal to or smaller than the total value. Based on this determination result, the power measurement device 10 determines whether or not the current transformers CT are disposed in the respective correct directions. Hence, even if, in addition to the equipment to which power is supplied and the equipment that supplies power, the equipment to which power is supplied and which also supplies power (equipment that may produce reverse tidal current) is connected with a power line, the power measurement device 10 is capable of determining the incorrect disposition of the current transformer CT. In addition, even if, in addition to the equipment to which power is supplied and the equipment which supplies power, the equipment to which power is supplied and which also supplies power (equipment that may produce reverse tidal current) is connected with a power line, the power measurement device 10 of this embodiment is capable of measuring electric energy.

Yet still further, when the system constructor inputs the location where the current transformer is disposed (disposition information), the power measurement device 10 of this embodiment specifies whether the electric energy measured by the power measurer 13 shows a positive sign, a negative sign, or both signs when the current transformer CT is correctly disposed based on the input disposition information. Hence, it is unnecessary for the system constructor to input information needing an expert knowledge, such as whether the equipment connected with the power line is the equipment to which power is supplied, the equipment that supplies power, or the equipment to which power is supplied and which also supplies power. Accordingly, even if the system constructor lacks the expert knowledge about the equipment, the system constructor is enabled to recognize the incorrect disposition of the current transformer CT with the aid of the power measurement device 10.

The embodiment of the present disclosure was explained above, but the present disclosure is not limited to the above embodiment, and various changes and modifications are applicable thereto.

According to the above power measurement device 10, the current transformers CT are disposed on power lines connected with the equipment that supplies power, that is, the power lines L1b, L2b connected with the solar power generation system 31, and the power lines L1c, L2c connected with the electricity storage system 32, but the present disclosure is not limited to this structure.

The current transformers CT may be disposed on some power lines connected with the equipment as long as the above general rule (general rule in which electric energy supplied to external load through power lines L1, N, and L2 is equal to or smaller than electric energy supplied from equipment that supplies power since power supplied from equipment that supplies power is consumed by at least home equipment 33) is satisfied when the current transformers CT are disposed in the respective correct directions. For example, the current transformer CT may be disposed on no outer circumference of the power line L1c, L2c connected with the electricity storage system 32 but on the outer circumference of the power line L1b, L2b connected with the solar power generation system 31. Conversely, the current transformer CT may be disposed on no outer circumference of the power line L1b, L2b connected with the solar power generation system 31 but on the outer circumference of the power line L1c, L2c connected with the electricity storage system 32.

However, it is desirable that the current transformers CT be disposed on the respective outer circumferences of all power lines connected with the equipment that supplies power.

In addition, when the system constructor inputs the location where the current transformer is disposed (disposition information) the above power measurement device 10 specified whether the electric energy measured by the power measurer 13 shows a positive sign, a negative sign, or both signs when the current transformer CT is correctly disposed based on the input disposition information, but the present disclosure is not limited to this case. When, for example, the system constructor has an expert knowledge, the power measurement device 10 may employ a structure that enables the system constructor to directly input whether the electric energy measured by the power measurer 13 when the current transformer CT is correctly disposed shows a positive sign, a negative, or both signs.

An example outputter 16 of the above power measurement device 10 was a display, but the present disclosure is not limited to this case. For example, the outputter 16 may be an interface that establishes a communication with an external personal computer. When, for example, the outputter 16 is an interface, the arithmetic controller 14 (determining block 140) outputs, to the external personal computer through the outputter 16, information of the screen indicating the incorrect connection of the terminal T1 to T3 or information of the screen indicating the incorrect disposition of the current transformer CT. Accordingly, the display of the external personal computer enables the system constructor or the user to visually check the screen indicating the incorrect connection of the terminal T1 to T3 or the screen indicating the incorrect disposition of the current transformer CT.

Still further, according to the above power measurement device 10, the current detection element applied was the current transformer CT, but the present disclosure is not limited to this structure. For example, a Hall element may be applied as the current detection element.

The program run by the arithmetic controller 14 in the above embodiment may be distributed in a manner stored in a non-transitory computer-readable recording medium, such as a flexible disk, a CD-ROM (Compact Disc Read-Only Memory), a DVD (Digital Versatile Disc), or an MO (Magneto-Optical Disc), and may be installed in a computer or the like to construct a device that executes the processes illustrated in FIGS. 11 and 12.

In addition, the above program may be stored in a disk device or the like of an arbitrary server device over a communication network like the Internet, and may be, for example, downloaded in a manner super imposed on carrier waves.

Still further, when the above processes illustrated in FIGS. 11 and 12 are shared and realized by respective OSs (Operating System) or are realized by the cooperative work by the OS with an application, portions other than the OS may be distributed in a manner stored in a medium or may be, for example, downloaded.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

This application is based on Japanese Patent Application No. 2013-124764 filed on Jun. 13, 2013. The entire contents of the specification, claims, and drawings of Japanese Patent Application No. 2013-124764 are herein incorporated in this specification by reference.

INDUSTRIAL APPLICABILITY

The present disclosure is suitable for a case in which a current detection element may be disposed in an incorrect direction on a power line.

REFERENCE SIGNS LIST

10 Power measurement device
11 Voltage measurer
12 Current measurer
13 Power measurer
14 Arithmetic controller
15 Inputter
16 Outputter
31 Solar power generation system
32 Electricity storage system
33 Home equipment
35 Master breaker
36a, 36b, 36c, 36d Branching breaker

The invention claimed is:

1. A power measurement device comprising:
a voltage measurer connected with a plurality of power lines feeding power in a plurality of phases, the voltage measurer being configured to measure a voltage in each phase of the plurality of phases;
a current measurer configured to measure, through a plurality of current detection elements each disposed on a power line of the plurality of power lines, a current input to equipment connected with the power line, or a current output by the equipment, for each of the plurality of current detection elements;
a power measurer configured to measure, for each current detection element, electric energy supplied to the equipment or electric energy supplied from the equipment based on the current measured by the current measurer and the voltage measured by the voltage measurer;
a sign table memory configured to store a sign table indicating which of a positive sign, a negative sign, and both positive and negative signs the electric energy measured by the power measurer should have when the current detection element is disposed in a correct direction on the power line for each power line;
an acceptor configured to accept, from a user, disposition information indicating on which power line the current detection element is disposed, for each of the current detection elements;
a sign information generator configured to generate sign information indicating which of a positive sign, a negative sign, and both positive and negative signs the electric energy measured by the power measurer should have when the current detection element is disposed in a correct direction on the power line based on the sign table stored in the sign table memory and the disposition information accepted by the acceptor, for each of the plurality of current detection elements;
a sign information memory configured to store the sign information generated by the sign information generator; and
a controller configured to determine that, when a sign indicated by the sign information stored in the sign information memory is inconsistent with a sign of the electric energy measured by the power measurer, the current detection element is disposed in an incorrect direction on the power line.

2. The power measurement device according to claim 1, wherein:
the power line connected with the equipment is connected to one terminal of a master switch;
distribution lines are connected to another terminal of the master switch;
a further current detection element is disposed on a distribution line of the distribution lines;
the power measurer is further configured to measure electric energy supplied to, through the distribution line connected with the master switch, an external load;
the sign information indicates which of the positive sign, the negative sign, and both positive and negative signs the electric energy measured by the power measurer should have when the current detection element is disposed in the correct direction on the power line;
the power measurement device further comprises:
a current determiner configured to determine, based on a sign of the electric energy measured by the power measurer, whether or not a current flows from the distribution line to the external load;
a specifier configured to specify, based on the sign of the electric energy measured by the power measurer, the power line causing the current output by the equipment to flow when the current determiner determines that the current flows from the distribution line to the external load;
a total value determiner configured to determine whether or not electric energy supplied to the external load through the distribution line and acquired based on the electric energy measured by the power measurer is equal to or smaller than a total value of electric energy supplied through the power line specified by the specifier and acquired based on the electric energy measured by the power measurer; and
an incorrect disposition determiner configured to determine that, when the total value determiner determines that the electric energy supplied to the external load exceeds the total value, the current detection element is disposed in an incorrect direction on the power line.

3. The power measurement device according to claim 1, further comprising a notifier configured to give a notification that the current detection element is disposed in an incorrect direction on the power line when the current detection element is determined to be disposed in an incorrect direction on the power line.

4. The power measurement device according to claim 1, wherein:
the voltage measurer is configured to measure the voltage in each phase through a terminal connected with the power line;

the power measurement device further comprises:
- a voltage determiner configured to determine whether or not the voltage in each phase measured by the voltage measurer is within a predetermined range; and
- a notifier configured to give a notification that the terminal is falsely connected with the power line when the measured voltage in each phase is determined to be out of the predetermined range.

5. The power measurement device according to claim 1, further comprising an outputter configured to output, when the current detection element is determined to be disposed in a correct direction on the power line, the electric energy measured by the power measurer to an external device.

6. A determination method to determine whether or not a current detection element of a plurality of current detection elements is disposed in a correct direction, the method comprising:
- measuring a voltage in each phase of a plurality of phases applied to a plurality of power lines feeding power in the plurality of phases;
- measuring, through the plurality of current detection elements disposed on the plurality of power lines, a current input to equipment connected with the power line, or a current output by the equipment for each of the plurality of current detection elements;
- measuring, for each current detection element, electric energy supplied to the equipment or electric energy supplied from the equipment based on the measured current and the measured voltage;
- storing a sign table indicating which of a positive sign, a negative sign and both positive and negative signs the measured electric energy should have when the current detection element is disposed in a correct direction on the power line for each power line;
- accepting, from a user, disposition information indicating on which power line the current detection element is disposed, for each of the plurality of current detection elements;
- generating sign information indicating which of a positive sign, negative sign and both positive and negative signs the measured electric energy should have when the current detection element is disposed in a correct direction on the power line based on the stored sign table and the accepted disposition information for each of the plurality of current detection elements;
- storing the generated sign information; and
- determining that, when a sign indicated by the stored sign information is inconsistent with a sign of the measured electric energy, the current detection element is disposed in an incorrect direction on the power line.

7. A non-transitory computer readable recording medium having stored therein a program for causing a computer to function as:
- a voltage measuring function of receiving, from a voltage measurer being configured to measure a voltage in each phase of a plurality of phases applied to a plurality of power lines feeding power in the plurality of phases, a measured value of the voltage in each phase;
- a current measuring function of receiving a measured value of the current, from a current measurer configured to measure, through a plurality of current detection elements disposed on the plurality of power lines, a current input to equipment connected with the power line, or a current output by the equipment for each of the plurality of current detection elements;
- a power measuring function of measuring, for each current detection element, electric energy supplied to the equipment or electric energy supplied from the equipment based on the measured current value received by the current measuring function and the measured voltage value received by the voltage measuring function;
- a sign table storing function of storing sign information indicating which of a positive sign, a negative sign and both positive and negative signs the electric energy measured by the power measuring function should have when the current detection element is disposed in a correct direction on the power line for each power line;
- an accepting function of accepting, from a user, disposition information indicating on which power line the current detection element is disposed, for each of the plurality of current detection elements;
- a sign information generating function of generating sign information indicating which of a positive sign, a negative sign and both positive and negative signs the electric energy measured by the power measuring function should have when the current detection element is disposed in a correct direction on the power line based on the sign table stored by the sign table storing function and the disposition information accepted by the accepting function, for each of the plurality of current detection elements;
- a sign information storing function of storing the sign information generated by the sign information generating function; and
- a controlling function of determining that, when a sign indicated by the sign information stored by the sign information storing function is inconsistent with a sign of the electric energy measured by the power measuring function, the current detection element is disposed in an incorrect direction on the power line.

* * * * *